US012089396B2

(12) United States Patent
Lee

(10) Patent No.: US 12,089,396 B2
(45) Date of Patent: Sep. 10, 2024

(54) SEMICONDUCTOR DEVICE

(71) Applicant: Samsung Electronics Co., Ltd., Suwon-si (KR)

(72) Inventor: Jongmin Lee, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 259 days.

(21) Appl. No.: 17/724,344

(22) Filed: Apr. 19, 2022

(65) Prior Publication Data
US 2023/0034701 A1 Feb. 2, 2023

(30) Foreign Application Priority Data

Jul. 27, 2021 (KR) ........................ 10-2021-0098483

(51) Int. Cl.
*H01L 21/00* (2006.01)
*H01L 49/02* (2006.01)
*H10B 12/00* (2023.01)

(52) U.S. Cl.
CPC .......... *H10B 12/315* (2023.02); *H01L 28/92* (2013.01); *H10B 12/50* (2023.02); *H10B 12/0335* (2023.02); *H10B 12/09* (2023.02)

(58) Field of Classification Search
CPC .. H10B 12/315; H10B 12/50; H10B 12/0335; H10B 12/09; H01L 28/92
See application file for complete search history.

(56) References Cited

U.S. PATENT DOCUMENTS

| | | | |
|---|---|---|---|
| 8,786,000 B2 | 7/2014 | Hasunuma | |
| 8,912,629 B2 | 12/2014 | Seo | |
| 8,952,423 B2 | 2/2015 | Jeon et al. | |
| 9,159,729 B2 | 10/2015 | Kim et al. | |
| 9,647,056 B2 | 5/2017 | Yoon et al. | |
| 10,468,415 B2 | 11/2019 | You et al. | |

(Continued)

FOREIGN PATENT DOCUMENTS

| | | |
|---|---|---|
| CN | 113140252 A | 7/2021 |
| KR | 101913316 B1 | 10/2018 |
| TW | 202013483 A | 4/2020 |

OTHER PUBLICATIONS

Taiwanese Office Action and Search Report dated Feb. 10, 2023, issued in Taiwanese Patent Application No. 111118693.

*Primary Examiner* — Richard A Booth
(74) *Attorney, Agent, or Firm* — Harness, Dickey & Pierce, P.L.C.

(57) ABSTRACT

A semiconductor device may include a cell capacitor including first lower electrodes, a first upper support layer pattern, a first dielectric layer, and a first upper electrode. The decoupling capacitor may include second lower electrodes, a second upper support layer pattern, a second dielectric layer, and a second upper electrode. The first and second lower electrodes may be arranged in a honeycomb pattern at each vertex of a hexagon and a center of the hexagon. The first upper support layer pattern may be connected to upper sidewalls of the first lower electrodes. The first upper support layer pattern may correspond to a first plate defining first openings. The second upper support layer pattern may be connected to upper sidewalls of the second electrodes. The second upper support layer pattern may correspond to a second plate defining second openings having a shape different from a shape of the first opening.

20 Claims, 15 Drawing Sheets

(56) References Cited

U.S. PATENT DOCUMENTS

| | | |
|---|---|---|
| 10,607,997 B2 | 3/2020 | Kim et al. |
| 10,804,219 B2 | 10/2020 | Sohn |
| 10,943,908 B2 | 3/2021 | Bae et al. |
| 11,106,535 B2 | 8/2021 | Cho et al. |
| 2020/0144205 A1* | 5/2020 | Wang .................... H01L 29/945 |
| 2023/0189511 A1* | 6/2023 | Lee ...................... H10B 12/033 257/532 |

* cited by examiner

SEMICONDUCTOR DEVICE

CROSS-REFERENCE TO RELATED APPLICATION

This application claims priority under 35 USC § 119 to Korean Patent Application No. 10-2021-0098483, filed on Jul. 27, 2021, in the Korean Intellectual Property Office (KIPO), the contents of which are incorporated by reference herein in their entirety.

BACKGROUND

Some example embodiments relate to a semiconductor device. More particularly, various example embodiments relate to a DRAM (dynamic random access memory) device including a capacitor.

A DRAM device may include memory cells and peripheral circuits. In a DRAM device, the memory cells may include transistors and cell capacitors, and the peripheral circuits may include decoupling capacitors. In the DRAM device, capacitors included in the memory cells and decoupling capacitors included in the peripheral circuits should not be defective.

SUMMARY

Some example embodiments provide a semiconductor device including a capacitor having a high capacitance and with a reduced amount of and/or impact from defects.

According to some example embodiments, there is provided a semiconductor device. The semiconductor device may include a cell capacitor on a memory cell region of a substrate, and a decoupling capacitor on a decoupling capacitor region of the substrate. The cell capacitor may include a plurality of first lower electrodes, a first upper support layer pattern, a first dielectric layer, and a first upper electrode. The decoupling capacitor may include a plurality of second lower electrodes, a second upper support layer pattern, a second dielectric layer, and a second upper electrode. The first and second lower electrodes may be in a honeycomb pattern arranged at each vertex of a connected hexagon and a center of the hexagon. The plurality of first and second lower electrodes may be arranged in rows along a first direction, and each of the rows may be in a second direction perpendicular to the first direction. The first upper support layer pattern may be connected to upper sidewalls of the first lower electrodes. The first upper support layer pattern may be between the first lower electrodes, and the first upper support layer pattern may correspond to a first plate defining first openings. All of the first lower electrodes may be partially exposed by the first openings. The second upper support layer pattern may be connected to the upper sidewalls of the second lower electrodes. The second upper support layer pattern may be between the second lower electrodes, and the second upper support layer pattern may correspond to a second plate defining second openings. Some of the second lower electrodes may be partially exposed by the second openings, and some of second lower electrodes may not be exposed by the second openings.

According to some example embodiments, there is provided a semiconductor device. The semiconductor device may include a substrate, a cell lower structure, a common electrode, a plurality of first lower electrodes, a first upper support layer pattern, a first dielectric layer, a first upper electrode, a plurality of second lower electrodes, a second upper support layer pattern, and a second dielectric layer and a second upper electrode. The substrate includes a memory cell region and a decoupling capacitor region. The cell lower structure may include a plurality of bit line structures, a plurality of contact plugs, and a plurality of pad electrodes, with the plurality of bit line structures, the plurality of contact plugs, and the plurality of pad electrodes on the memory cell region of the substrate. The common electrode may be on the decoupling capacitor region of the substrate. The plurality of first lower electrodes may be on the plurality of pad electrodes, respectively. The first lower electrodes may be in a honeycomb pattern, which is arranged at each vertex of a connected hexagon and a center of the hexagon. The first upper support layer pattern may be connected to upper sidewalls of the first lower electrodes. The first upper support layer pattern may be between the first lower electrode. The first upper support layer pattern may correspond to a first plate defining first openings. The first dielectric layer and the first upper electrode may be on surfaces of the first lower electrodes and the first upper support layer. The second lower electrodes may be on the common electrode. The second lower electrodes arranged in the honeycomb structure. The second upper support layer pattern may be connected to upper sidewalls of the second lower electrodes. The second upper support layer pattern may be between the second lower electrodes. The second upper support layer pattern may correspond to a second plate defining second openings different from the first openings. The second dielectric layer and the second upper electrode may be on surfaces of the second lower electrodes and the second upper support layer pattern. The first and second lower electrodes may be arranged in rows along a first direction. Each of the rows may be disposed in a second direction perpendicular to the first direction. The plurality of second lower electrodes may include exposed lower electrodes exposed by the second openings and non-exposed lower electrodes not exposed by the second openings.

According to some example embodiments, there is provided a semiconductor device. The semiconductor device may include a cell capacitor on a memory cell region of a substrate, and a decoupling capacitor on a decoupling capacitor region of the substrate. The cell capacitor may include a plurality of first lower electrodes, a first upper support layer pattern, a first dielectric layer, and a first upper electrode. The decoupling capacitor may include a plurality of second lower electrodes, a second upper support layer pattern, a second dielectric layer, and a second upper electrode. The plurality of first and second lower electrodes may be arranged in a honeycomb pattern, which is arranged at each vertex of a connected hexagon and a center of the hexagon. The plurality of first and second lower electrodes may extend as rows along a first direction, and each of the rows may be arranged in a second direction perpendicular to the first direction. The first upper support layer pattern may be between the first lower electrodes to be connected upper sidewalls of the first lower electrodes, and the first upper support layer pattern may correspond to a first plate defining first openings. One first opening may partially expose some of the plurality of the first lower electrodes, and each of the first openings may have an elliptical shape in a plan view. The second upper support layer pattern may be between the plurality of second lower electrodes to be connected upper sidewalls of the second lower electrodes, and the second upper support layer pattern may correspond to a second plate defining second openings different from the first openings. All of the plurality of first lower electrodes may be partially exposed by the first openings. Some of the plurality of second lower electrodes may be partially exposed by the second openings, and some of the plurality of second lower electrodes may not be exposed by the second openings.

In the semiconductor device in accordance with some example embodiments, defects of cell capacitors on the memory cell region and decoupling capacitors on the peripheral circuit region may be decreased.

BRIEF DESCRIPTION OF THE DRAWINGS

Some example embodiments will be more clearly understood from the following detailed description taken in conjunction with the accompanying drawings.

FIG. 1 is a plan view illustrating regions in a DRAM device in accordance with some example embodiments;

FIG. 2 is a plan view illustrating a memory cell region in the DRAM device in accordance with some example embodiments;

FIG. 3 is a cross-sectional view illustrating capacitors on each of the regions in the DRAM device in accordance with some example embodiments;

FIG. 4 is a plan view illustrating capacitors on each of the regions in the DRAM device in accordance with some example embodiments;

FIG. 5 is a perspective view illustrating portions of capacitors on each of the regions in the DRAM device in accordance with some example embodiments;

FIG. 6 is a cross-sectional view illustrating a case in which the first upper support layer pattern shown in FIG. 4 is misaligned;

FIG. 7 is a plan view illustrating an example of cell capacitor of a memory cell region in a DRAM device in accordance with some example embodiments;

FIG. 8 is a plan view illustrating an example of cell capacitor of a memory cell region in a DRAM device in accordance with some example embodiments;

FIG. 9 is a plan view illustrating an example of cell capacitor of a memory cell region in a DRAM device in accordance with some example embodiments;

FIG. 10 is a plan view illustrating an example of a decoupling capacitor in a DRAM device in accordance with some example embodiments; and FIGS. 11 to 17 are cross-sectional views illustrating a method of manufacturing a semiconductor device in accordance with some example embodiments.

DESCRIPTION OF VARIOUS EXAMPLE EMBODIMENTS

Figure 1:
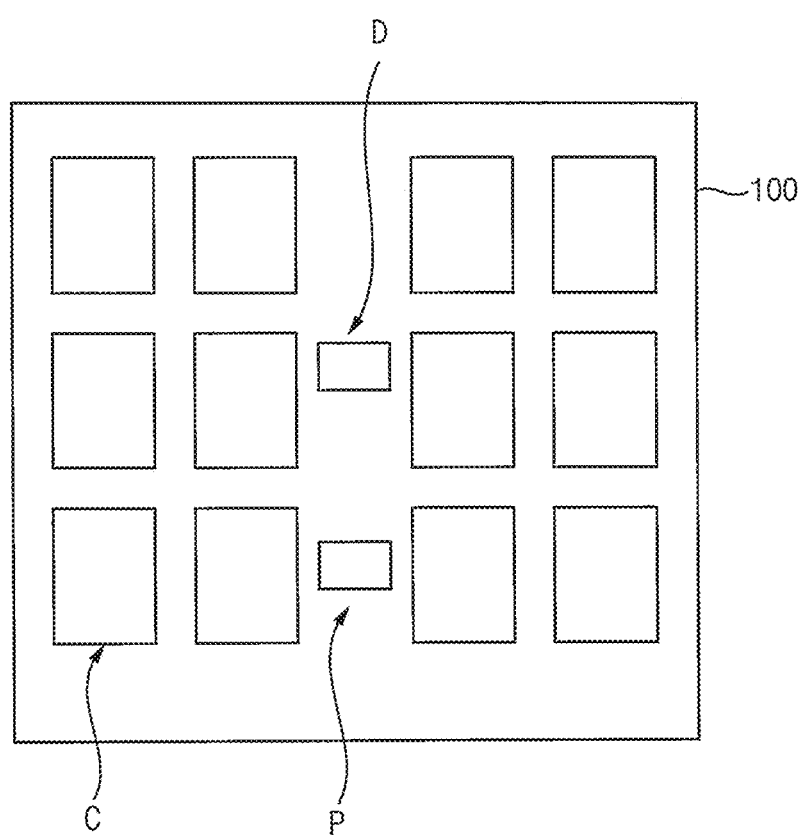
FIGS. 1 to 17 represent non-limiting, example embodiments as described herein.
Figure 2:
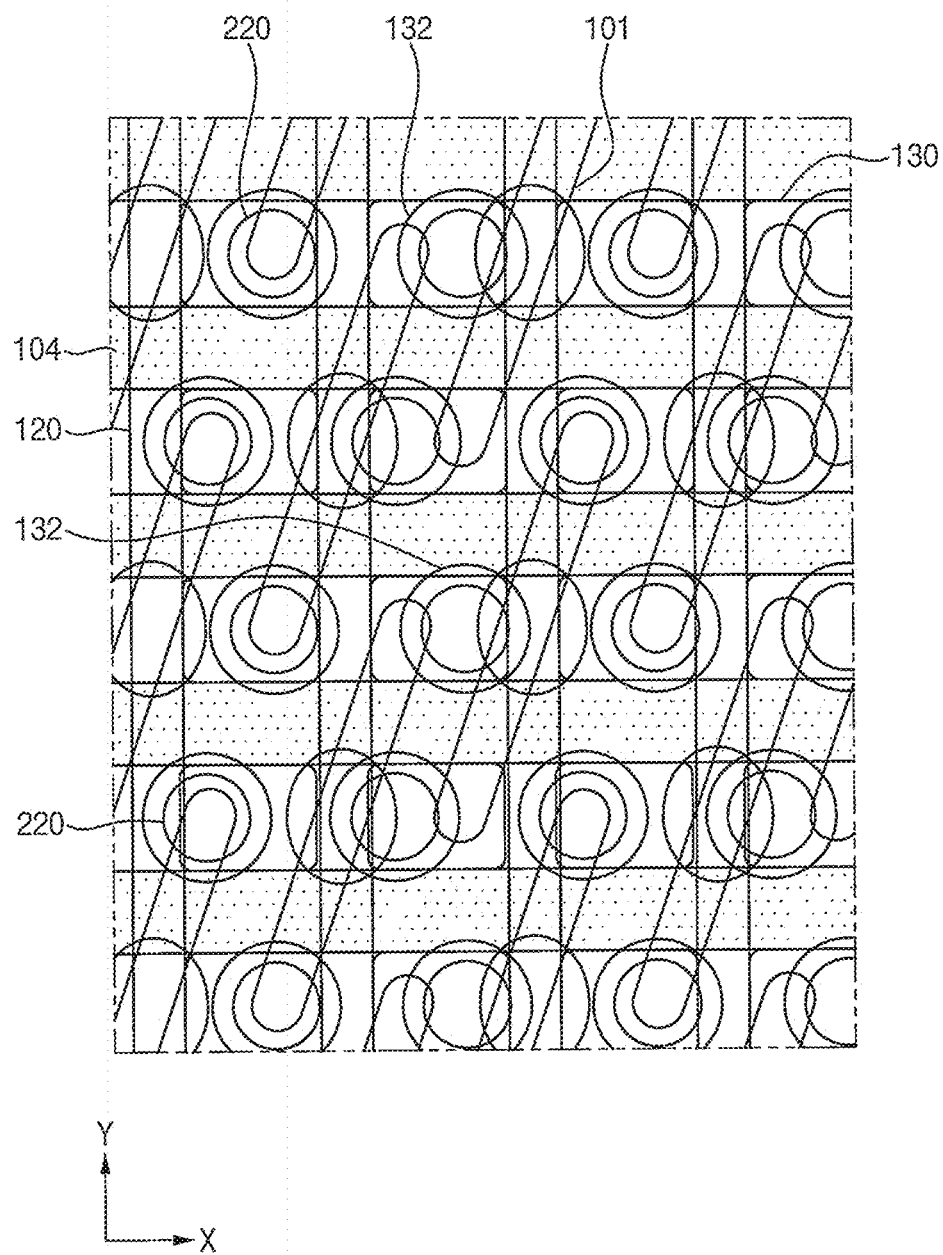
Figure 3:
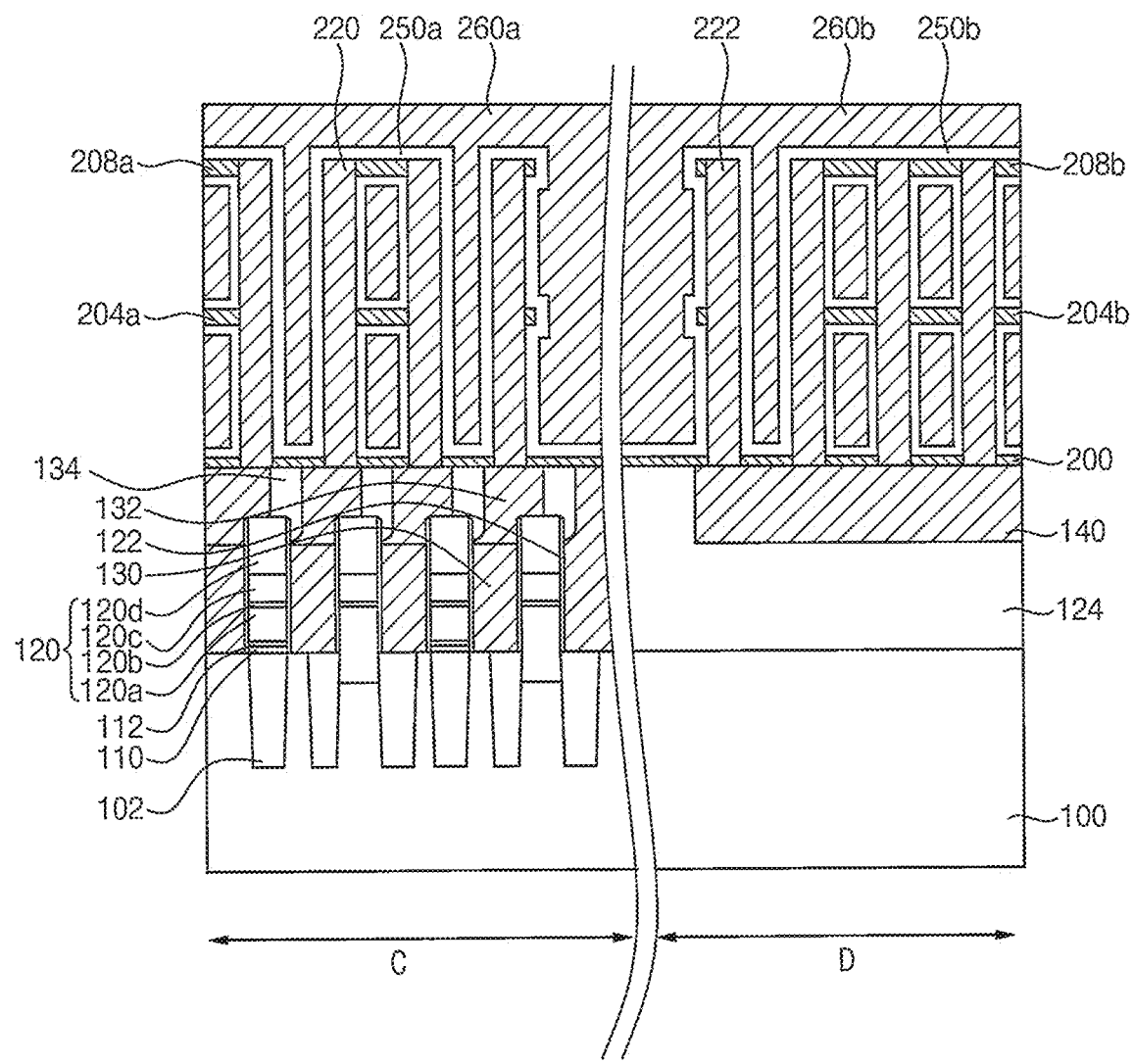
Figure 4:
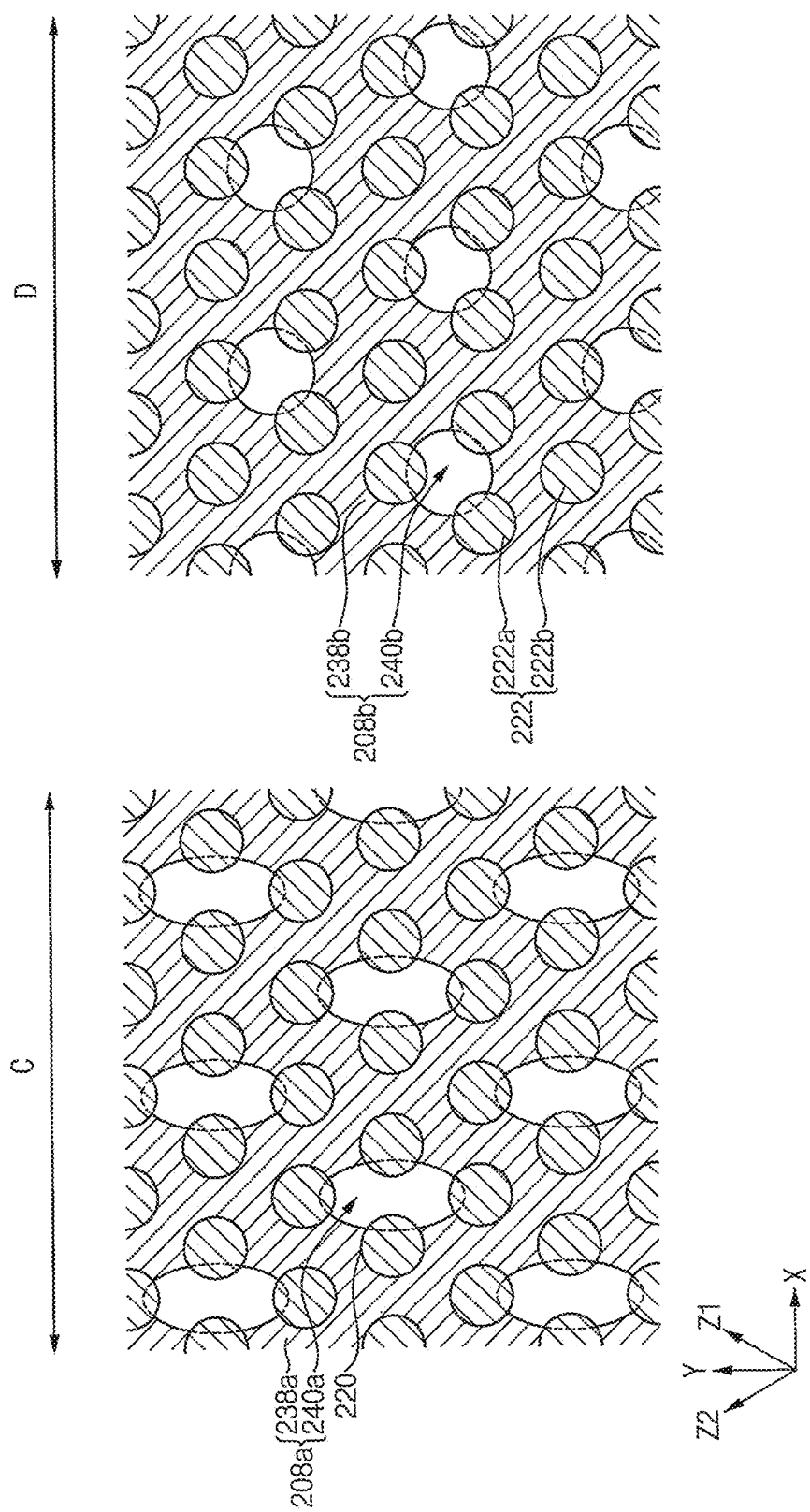
Figure 5:
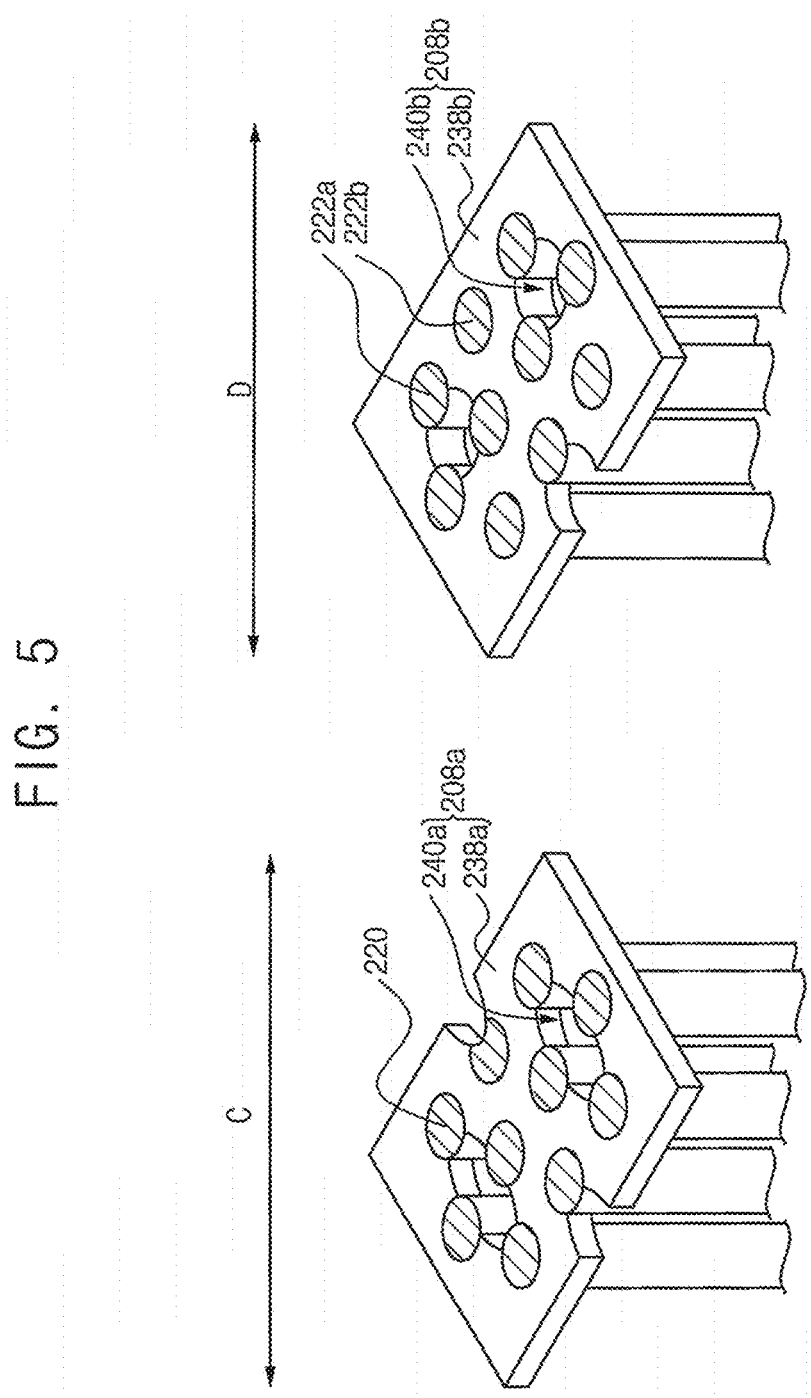

FIG. 1 is a plan view illustrating regions in a DRAM device in accordance with some example embodiments. FIG. 2 is a plan view illustrating a memory cell region in the DRAM device in accordance with some example embodiments. FIG. 3 is a cross-sectional view illustrating capacitors on each of the regions in the DRAM device in accordance with some example embodiments. FIG. 4 is a plan view illustrating capacitors on each of the regions in the DRAM device in accordance with some example embodiments. FIG. 5 is a perspective view illustrating portions of capacitors on each of the regions in the DRAM device in accordance with some example embodiments.

In order to avoid complication of the drawings, a support layer pattern of cell capacitors is not shown in FIG. 2. FIGS. 4 and 5 show an arrangement of first lower electrodes and a first upper support layer pattern of the cell capacitors and an arrangement of second lower electrodes and a second upper support layer pattern of decoupling capacitors.

Referring to FIGS. 1 to 5, the DRAM device may be formed on a substrate 100. The substrate 100 may include a memory cell region C in which memory cells, such as one-transistor, one-capacitor (1T1C) memory cells are formed and a peripheral circuit region P in which peripheral circuits for driving and/or sensing the memory cells are formed.

The substrate may include a plurality of memory cell regions C. The peripheral circuit region P may be disposed between the memory cell regions C, and may surround the memory cell regions C. The peripheral circuit region P may include a decoupling capacitor region D in which decoupling capacitors are formed.

The substrate 100 may be or may include a wafer including silicon, germanium, silicon-germanium, or a III-V compound such as GaP, GaAs, or GaSb. In some example embodiments, the substrate 100 may be a silicon-on-insulator (SOI) wafer or a germanium-on-insulator (GOI) wafer, and may or may not be doped, e.g. may be lightly doped with boron.

Selection transistors (e.g. access transistors), cell capacitors, and a bit line structure 120 may be formed on the memory cell region C. A unit memory cell may include one selection transistor and one cell capacitor.

Address decoders, an internal power circuit for supplying an internal power supply voltage to each of address decoders, decoupling capacitors, etc. may be formed on/within the peripheral circuit region P. The internal power circuit may be supplied with an external power supply potential (Vcc) or a ground potential (GND) that are from outside of the DRAM device. The internal power circuit may generate an internal power supply voltage that steps down/reduces the external power supply potential to another voltage, e.g. a variably-determined or predetermined voltage, and the internal power supply voltage may be supplied to the address decoder. The decoupling capacitors may be formed between a wiring for connecting the internal power circuit and the address decoder to each other and a ground potential. As the decoupling capacitors are formed, noise, such as high-frequency noise, of the internal power voltage supplied to the address decoder may be decreased.

First, a memory cell structure formed on the memory cell region C of the substrate 100 is described.

An isolation layer 102 may be formed at the memory cell region C of the substrate 100. A portion of the substrate 100 between isolation layers 102 may be defined as an active region 101.

A gate trench extending in a first direction X parallel to an upper surface of the substrate 100 may be formed at the substrate 100. A gate structure 104 may be formed in the gate trench.

In some example embodiments, the gate structure 104 may include a gate insulation layer, a gate electrode, and a capping insulation pattern that are stacked. A plurality of the gate structures 104 may be arranged in a second direction Y parallel to the upper surface of the substrate 100 and perpendicular to the first direction X.

Impurity regions serving as source/drain region may be formed (e.g. may be implanted and activated) at the active region 101 between the gate structures 104. For example, the impurity regions may include a first impurity region electrically connected to a bit line structure 120 and a second impurity region electrically connected to a cell capacitor. The gate structure 104 and the impurity regions may serve as the access transistor/the selection transistor.

A pad insulation pattern 110 and a first etch stop layer pattern 112 may be formed on the active region 101, the isolation layer 102, and the gate structure 104. For example, the pad insulation pattern 110 may include an oxide such as silicon oxide, and the first etch stop layer pattern 112 may include a nitride such as silicon nitride.

A recess may be formed at a portion of the substrate 100 on which the pad insulation pattern 110 and the first etch stop layer pattern 112 are not formed. A top surface of the first impurity region may be exposed by a bottom of the recess.

The bit line structure 120 may be formed on the first etch stop layer pattern 112 and the recess. The bit line structure 120 may include a conductive pattern 120a, a barrier metal pattern 120b, a metal pattern 120c, and a hard mask pattern 120d. The conductive pattern 120a may include, e.g., polysilicon doped with impurities such as phosphorus. The barrier metal pattern 120b may include, e.g., a metal such as titanium (Ti) or tantalum (Ta) and/or a metal nitride such as titanium nitride or tantalum nitride, and the metal pattern 120c may include, e.g., a metal such as tungsten (W). The bit line structure 120 may extend in the second direction Y, and a plurality of the bit line structures 120 may be arranged in the first direction X. In some example embodiments, a spacer 122 may be formed on a sidewall of the bit line structure 120.

A first insulating interlayer may fill a space between the bit line structures 120.

A contact plug 130 may pass through the first insulating interlayer, the first etch stop layer pattern 112, and the pad insulation pattern 110. The contact plug 130 may contact the second impurity region. A landing pad 132 may be formed on the contact plug 130. The landing pad 132 may contact the contact plug 130. The contact plug 130 may be disposed between the bit line structures 120. An insulation pattern 134 may be formed between the landing pads 132.

A second etch stop layer 200 may be formed on the landing pad 132, the insulation pattern 134, and the first insulating interlayer. A cell capacitor may contact the landing pad 132 through the second etch stop layer 200. A structure positioned under the second etch stop layer 200 is referred to as a cell lower structure.

The second etch stop layer 200 may include, e.g., at least one of silicon nitride, silicon oxynitride, or the like. The cell capacitor may include a first lower electrode 220, a first dielectric layer 250a, a first upper electrode 260a, a first lower support layer pattern 204a, and a first upper support layer pattern 208a.

In the memory cell region C, the first lower electrode 220 may contact the landing pad 132 through the second etch stop layer 200.

In reference to FIGS. 4 and 5, an arrangement of the first lower electrodes and the first upper support layer pattern of the cell capacitor in the memory cell region C is described in detail.

Referring to FIGS. 4 and 5, each of the first lower electrodes 220 may be formed on the landing pad 132. The first lower electrodes 220 may be arranged in a honeycomb structure, which is disposed at each vertex of a hexagon (e.g. a connected hexagon) and a center of the hexagon. Although example embodiments are described with a regular hexagon, example embodiments are not limited thereto.

The first lower electrodes 220 may form rows along the first direction X, and each of the rows may be disposed in the second direction Y perpendicular to the first direction X.

The first lower electrodes 220 arranged in every other row, e.g. in odd-numbered rows may be spaced apart from each other by the same space, and the first lower electrodes 220 arranged in the other rows, e.g. the even-numbered rows may be spaced apart from each other by the same space. The first lower electrodes 220 arranged in even-numbered rows may be disposed not to be parallel to the first lower electrodes 220 arranged in odd-numbered rows in the second direction Y. Each of the first lower electrodes 220 of the odd-numbered rows may be disposed at a portion between the first lower electrodes 220 of the even-numbered rows. For example, the first lower electrodes 220 of the odd-numbered rows and the first lower electrodes 220 of the even-numbered column may be arranged in a zig-zag fashion in the second direction Y.

In the arrangement of the first lower electrodes 220, six neighboring first lower electrodes may be disposed around one first lower electrode 220. Around the one first lower electrode 220, two neighboring first lower electrodes in the first direction X, two neighboring first lower electrodes in a first oblique direction Z1, and two neighboring first lower electrodes in a second oblique direction Z2 may be disposed. The first oblique direction Z1 may be a direction having an angle of 60 degrees to the first direction X, and the second oblique direction Z2 may be a direction having an angle of 120 degrees to the first direction X; however, example embodiments are not necessarily limited to the above angles.

For example, a distance between centers of neighboring first lower electrodes 220 in the first direction X may be 3.0 F. Each of a distance between centers of neighboring first lower electrodes 220 in the first oblique direction Z1 and a distance between centers of neighboring first lower electrodes 220 in the second oblique direction Z2 may be 2.6 F. Here, the variable F means or refers to a minimum lithographic feature size.

In some example embodiments, the first lower electrodes 220 may have a filled cylindrical shape, that is, a pillar shape. In some example embodiments, the first lower electrodes may have a hollow cylindrical shape.

In some example embodiments, the first lower electrode 220 may include a metal such as at least one of Ti, W, Ni, or Co or a metal nitride such as at least one of TiN, TiSiN, TiAlN, TaN, TaSiN, or WN. For example, the first lower electrode 220 may include TiN.

Each of the first lower support layer pattern 204a and the first upper support layer pattern 208a may be disposed between the first lower electrodes 220. Each of the first lower support layer pattern 204a and the first upper support layer pattern 208a may be connected to first lower electrodes 220, and thus each of the first lower support layer pattern 204a and the first upper support layer pattern 208a may support the first lower electrodes 220. The first lower support layer pattern 204a and the first upper support layer pattern 208a may include an insulation material, e.g., silicon nitride and/or silicon oxynitride.

The first upper support layer pattern 208a may support upper portions of the first lower electrodes 220 to each other. The first upper support layer pattern 208a may be connected upper sidewalls of the first lower electrodes 220. An upper surface of the first upper support layer pattern 208a may be coplanar with an upper surface of the first lower electrode 220.

The first upper support layer pattern 208a may be a first upper plate 238a having/defining first openings 240a. The first upper plate 238a may be formed between upper portions of the first lower electrodes 220. The first openings 240a may be arranged to have a variably determined or predetermined pattern. Upper sidewalls of the plurality of first lower electrodes 220 may be partially exposed by the first openings 240a.

The first openings 240a may partially expose all of the first lower electrodes 220 in the cell capacitors. Therefore, the first lower electrode not exposed by the first openings 240a may not be provided in/within the memory cell region C.

As described above, the first openings 240a may have an all-open structure exposing at least portion of all of the first lower electrodes 220 in the cell capacitors. Thus, a bridge defect between the first lower electrodes 220 and/or a leaning defect of the first lower electrodes 220 may be decreased by the first upper support layer pattern 208a. Therefore, defects, such as certain shorts, of the memory cell may be decreased in likelihood of occurrence and/or in impact, and electric characteristics between the cell capacitors may be more uniform.

In some example embodiments, one first opening 240a may partially expose upper sidewalls of four or more first lower electrodes 220 arranged in a plurality of neighboring rows. When the one first opening 240a is formed to expose less than four first lower electrodes 220, the first openings 240a may be very densely arranged. Thus, a patterning process of the first openings 240a may not be easy, e.g. may be difficult due to the density of first openings 240a.

In some example embodiments, the neighboring first openings may be disposed in parallel in the first direction X, and the neighboring first openings may be disposed in non-parallel in the second direction Y.

In some example embodiments, in a plan view, the first opening 240a may have an elliptical shape with a long axis in the second direction Y and/or an elliptical shape with a long axis in an oblique direction oblique to the first direction X. The elliptical shape of the first opening 240a may not have the first direction X as the long axis.

For example, as shown in FIG. 4, the one first opening 240a may be disposed between four first lower electrodes 220 arranged in three neighboring rows. The one first opening 240a may partially expose the upper sidewalls of the four first lower electrodes 220. The first opening 240a may have an elliptical shape having a short axis in the first direction X and a long axis in the second direction Y. In a plan view, the one of the first openings 240a may partially expose two first lower electrodes 220 disposed in the first direction X and two first lower electrodes 220 disposed in the second direction Y.

In the plan view, the one of the first openings 240a may partially expose one first lower electrode 220 of the odd-numbered row, two first lower electrodes 220 of even-numbered row, and one first lower electrode 220 of odd-numbered row sequentially disposed in the second direction Y. In this case, a length of the first opening 240a in the long axis may be greater than a width (i.e., diameter) of the upper surface of the first lower electrode 220.

The first lower support layer pattern 204a may support central portions of the first lower electrodes 220 to each other. The first lower support layer pattern 204a may be positioned under the first upper support layer pattern 208a.

In a plan view, the first lower support layer pattern 204a may have the same shape as the first upper support layer pattern 208a. For example, the first lower support layer pattern 204a may be a first lower plate having third openings. The first lower plate may be formed between center portions of the first lower electrodes 220. The third openings may be arranged to have a variably determined or predetermined pattern. The third openings may be disposed at the same position as the first openings 240a, in the plan view. The third openings and the first openings may face each other in a vertical direction. Thus, the third openings included in the first lower support layer pattern 204a may partially expose all of the first lower electrodes 220 in the cell capacitor.

As the first lower support layer pattern 204a and the first upper support layer pattern 208a are formed, the first lower electrodes 220 may be stably supported.

In some example embodiments, although not illustrated, the first lower support layer pattern may not be formed. In some example embodiments, two or more first lower support layer patterns may be formed under the first upper support layer pattern 208a.

The first dielectric layer 250a may be formed, e.g. conformally formed on surfaces of the first lower electrode 220, the first lower support layer pattern 204a, the first upper support layer pattern 208a, and the second etch stop layer 200. The first dielectric layer 250a may include a metal oxide such as at least one of HfO2, ZrO2, Al2O3, La2O3, Ta2O3, or TiO2, and/or a perovskite dielectric material such as SrTiO3 (STO), BaTiO3, PZT, PLZT or combinations thereof.

The first upper electrode 260a may be formed on the first dielectric layer 250a. Thus, the first dielectric layer 250a may be positioned between the first lower electrode 220 and the first upper electrode 260a. The first upper electrode 260a may include a metal such as at least one of Ti, W, Ni, or Co or a metal nitride such as at least one of TiN, TiSiN, TiAlN, TaN, TaSiN, or WN. For example, the first upper electrode 260a may include TiN.

Hereinafter, a structure formed on the decoupling capacitor region D in the peripheral circuit region P is described.

A lower structure may be formed on the decoupling capacitor region D of the substrate 100. The lower structure may include a first insulating interlayer 124. In some example embodiments, although not shown, the lower structure may further include a MOS transistor. A common electrode 140 may be formed on the lower structure. The common electrode 140 may be one wide pattern disposed in the decoupling capacitor region D. In some example embodiments, the common electrode 140 may include a material the same as a material of the landing pad 132 in the memory cell region C. In some example embodiments, an upper surface of the common electrode 140 may be substantially coplanar with an upper surface of the landing pad 132 in the memory cell region C.

The second etch stop layer 200 may be formed on the common electrode 140 and the first insulating interlayer 124. Decoupling capacitors may pass through the second etch stop layer 200, and the decoupling capacitors may be electrically connected to the common electrode 140.

The decoupling capacitor may include a second lower electrode 222, a second dielectric layer 250b, a second upper electrode 260b, a second lower support layer pattern 204b, and a second upper support layer pattern 208b.

In the decoupling capacitor region D, a plurality of second lower electrodes 222 may pass through the second etch stop layer 200, and may contact the common electrode 140. Each of the second lower electrodes 222 may be electrically connected to each other by the common electrode 140, and thus the second lower electrodes 222 may serve as one lower electrode. Accordingly, each of the decoupling capacitors may be operated as one decoupling capacitor. For example each of the decoupling capacitors may be connected to each other in a parallel fashion The second lower electrodes 222 may be arranged in the same structure as the first lower electrodes 220. For example, the second lower electrodes 222 may be arranged in the honeycomb structure, which is disposed at each vertex of a connected hexagon and a center of the hexagon. Each of the second lower electrodes 222 may form rows along the first direction X, and each of the rows may be disposed in the second direction Y perpendicular to the first direction X.

The second lower electrodes 222 may have the same shape as the first lower electrodes 220. In some example embodiments, the second lower electrodes 222 may have a filled cylindrical shape, for example, a pillar shape. In some example embodiments, the second lower electrodes may have a hollow cylindrical shape.

The second lower electrodes 222 may include a material the same as a material of the first lower electrodes 220, and may or may not be formed at the same time.

The second lower support layer pattern 204b and the second upper support layer pattern 208b may be disposed between the second lower electrodes 222. Each of the second lower support layer pattern 204b and the second upper support layer pattern 208b may be connected to second lower electrodes 222, and thus each of the second lower support layer pattern 204b and the second upper support layer pattern 208b may support the second lower electrodes 222. The second lower support layer pattern 204b may include a material the same as a material of the first lower support layer pattern 204a, and the second lower support layer pattern 204b may or may not be formed at the same time as that of the first lower support layer pattern 204a. The second upper support layer pattern 208b may be include a material the same as a material of the first upper support layer pattern 208a. The second lower support layer pattern 204b and the second upper support layer pattern 208b may include an insulation material, e.g., silicon nitride and/or silicon oxynitride.

The second upper support layer pattern 208b may have a shape different from a shape of the first upper support layer pattern 208a. The second lower support layer pattern 204b may have a shape different from a shape of the first lower support layer pattern 204a.

The second upper support layer pattern 208b may support upper portions of the second lower electrodes 222 to each other. The second upper support layer pattern 208b may be connected to upper sidewalls of the second lower electrodes 222. An upper surface of the second upper support layer pattern 208b may be coplanar with an upper surface of the second lower electrode 222.

The second upper support layer pattern 208b may be positioned between the second lower electrodes 222, and the second upper support layer pattern 208b may contact a portion of upper outer walls of the second lower electrodes 222.

The second upper support layer pattern 208b may be a second upper plate 238b including second openings 240b. The second upper plate 238b may be formed between upper portions of the second lower electrodes 222. The second openings 240b may have different arrangements and/or different shapes from the first openings 240a.

The second openings 240b may partially expose some of the second lower electrodes 222 in the decoupling capacitor. Thus, second lower electrodes 222a exposed by the second openings 240b and second lower electrodes 222b not exposed by the second openings 240b may be formed in the decoupling capacitor region D.

One second opening 240b may partially expose upper sidewalls of the plurality of second lower electrodes 222 arranged in a plurality of neighboring rows.

In some example embodiments, the neighboring second openings 240b may be arranged in parallel in the first direction X, and the neighboring second openings 240b may not be arranged in parallel in the second direction Y.

In some example embodiments, in a plan view, the second opening 240b may have a circular shape, and/or a bar shape in which the first direction X is a longitudinal direction.

For example, as shown in FIG. 4, the one second opening 240b may be disposed between the three second lower electrodes 222 arranged in two neighboring rows. The one second opening 240b may partially expose the upper sidewalls of three second lower electrodes 222. Some of second lower electrodes 222b may not be exposed by the second openings 240b. Therefore, even though the one second opening 240b may expose a number of less than four second lower electrodes 222a, the second opening 240b may not be densely arranged. Thus, the second opening 240b may be easily or more easily patterned.

In this case, in the plan view, the second opening 240b may have a circular shape. The one second opening 240b may partially expose two second lower electrodes 222 arranged in the first direction X and one second lower electrode adjacent to the two second lower electrodes 222 in the second direction Y. In the plan view, the one second opening 240b may expose two neighboring second lower electrodes 222 of a first set of alternating rows (e.g. an odd-numbered row) and one second lower electrodes 222 of the second set of alternating rows (e.g. an even-numbered row). All of the second lower electrodes 222 arranged in the odd-numbered rows may be partially exposed by the second opening 240b. Some of the second lower electrodes 222 arranged in the even-numbered row may not be exposed by the second opening 240b, and some of the second lower electrodes 222 arranged in the even-numbered row may be partially exposed by the second opening 240b. For example, the second lower electrode 222b not exposed by the second opening 240b and the second lower electrode 222a exposed by the second opening 240b may be alternately and repeatedly arranged in the even-numbered row.

A voltage supplied the decoupling capacitor may be higher than a voltage supplied the cell capacitor. In some example embodiments, the voltage supplied to the decoupling capacitor may be about 1.5 times to 3 times the voltage applied to the cell capacitor.

Since breakdown due to a high voltage may occur in the decoupling capacitor, the decoupling capacitor may be formed so that an electric field may not be concentrated in a specific portion of the decoupling capacitor. For example, in the decoupling capacitor, a thickness of the second dielectric layer 250b on the surface of the second lower electrode 222 may be more uniform.

Figure 6:
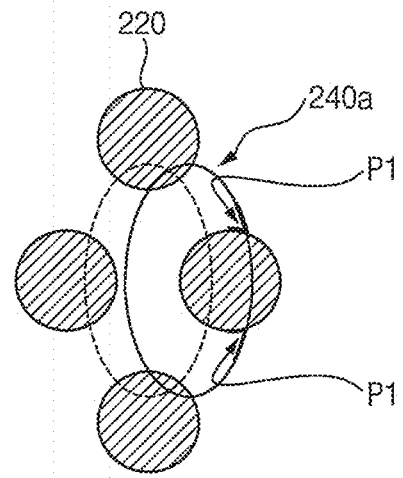

FIG. 6 is a cross-sectional view illustrating a case in which the first upper support layer pattern shown in FIG. 4 is misaligned.

Referring to FIG. 6, when the first openings 240a of the first upper support layer pattern 208a is not formed at a normal position, a position of the first lower electrodes 220 exposed by the first openings 240a may vary greatly. When the first opening 240a is misaligned, a narrow-angled apex region P1 may be formed at a contact portion of the first opening 240a and the first lower electrodes 220. The first dielectric layer 250a on the narrow-angled apex region P1 may have locally thin thickness. However, since the voltage supplied to the cell capacitor is low, even if the first dielectric layer 250a in the cell capacitor is locally thin, defects such as the breakdown may not occur or may be reduced in likelihood of occurrence and/or may have a reduced impact upon occurrence.

If the second upper support layer pattern in the decoupling capacitor have the same shape as the first upper support layer pattern in the decoupling capacitor, and the second opening is misaligned, a narrow-angled apex region P1 may be formed at a contact portion of the second opening and the second lower electrodes 220. The second dielectric layer on the narrow-angled apex region P1 may have locally thin thickness. Since the voltage supplied to the decoupling capacitor is high, a high electric field may be concentrated in a portion where the second dielectric layer is locally thin, so that defects of the decoupling capacitor may be more likely to occur and/or may have a more detrimental effect upon occurrence.

Therefore, in some example embodiments, the second upper support layer pattern 208b in the decoupling capacitor may not have the same shape as the first upper support layer pattern 208a. Also, the second openings 240b included in the second upper support layer pattern 208b may not expose all of the second lower electrodes 222.

Meanwhile, as described above, in the decoupling capacitor, the second openings 240b included in the second upper support layer pattern 208b may partially expose some of the second lower electrodes 222. Second lower electrodes 222a exposed by the second openings 240b and second lower electrodes 222b not exposed by the second openings 240b may be formed in the decoupling capacitor region D. In the plan view, the second opening 240b may have a circular shape or a bar shape in which the first direction X is a longitudinal direction. In this case, even if the second opening 240b is misaligned, a narrow angular apex portion may not be formed or the number of apex portions may be reduced at the contact portion between the second opening 240b and the second lower electrodes 222.

The second lower support layer pattern 204b may support central portions of the second lower electrodes 222 to each other. The second lower support layer pattern 204b may be positioned under the second upper support layer pattern 208b.

In some example embodiments, in the plan view, the second lower support layer pattern 204b may have the same shape as the second upper support layer pattern 208b. For example, the second lower support layer pattern 204b may be a third lower plate having/defining fourth openings. The third lower plate may be formed between central portions of the second electrodes 222. The fourth openings may be arranged to have a variably determined or predetermined pattern. The fourth openings may be disposed at the same position as the second openings 240b, in the plan view. The fourth openings and the second openings 240b may face each other in the vertical direction. Thus, the fourth openings included in the second lower support layer pattern 204b may partially expose some of the second lower electrodes 222 in the decoupling capacitor.

In some example embodiments, although not shown, the second lower support layer pattern may not be formed. In some example embodiments, two or more second lower support layer patterns may be formed under the second upper support layer pattern 208b.

The second dielectric layer 250b may be conformally formed on the surfaces of the second lower electrode 222, the second lower support layer pattern 204b, the second upper support layer pattern 208b, and the second etch stop layer 200. The second dielectric layer 250b may include a material the same as a material of the first dielectric layer 250a, and may be formed at the same time as, earlier than, and/or later than the first dielectric layer 250a.

The second upper electrode 260b may be disposed on the second dielectric layer 250b. Thus, the second dielectric layer 250b may be formed between the second lower electrode 222 and the second upper electrode 260b. The second upper electrode 260b may include a material the same as a material of the first upper electrode 260a, and may be formed at the same time as, earlier than, and/or later than, the first upper electrode 260a.

As described above, the first upper support layer pattern 208a included in the cell capacitor and the second upper support layer pattern 208b included in the decoupling capacitor may have different shapes. The first openings 240a included in the first upper support layer pattern 208a may partially expose all of the first lower electrodes 220 in the cell capacitors. The second openings 240b included in the second upper support layer pattern partially expose some of the second lower electrodes 222 in the decoupling capacitor. Some of the second lower electrodes 222 may not be exposed by the second openings 240b. Thus, the cell capacitor may be more stably supported by the first upper support layer pattern 208a, and breakdown failure due to the second upper support layer pattern 208b in the decoupling capacitor may be reduced in likelihood of occurrence and/or in impact.

Hereinafter, various shapes of the first lower support layer pattern and the first upper support layer pattern used in the cell capacitor of the memory cell region are presented.

Figure 7:
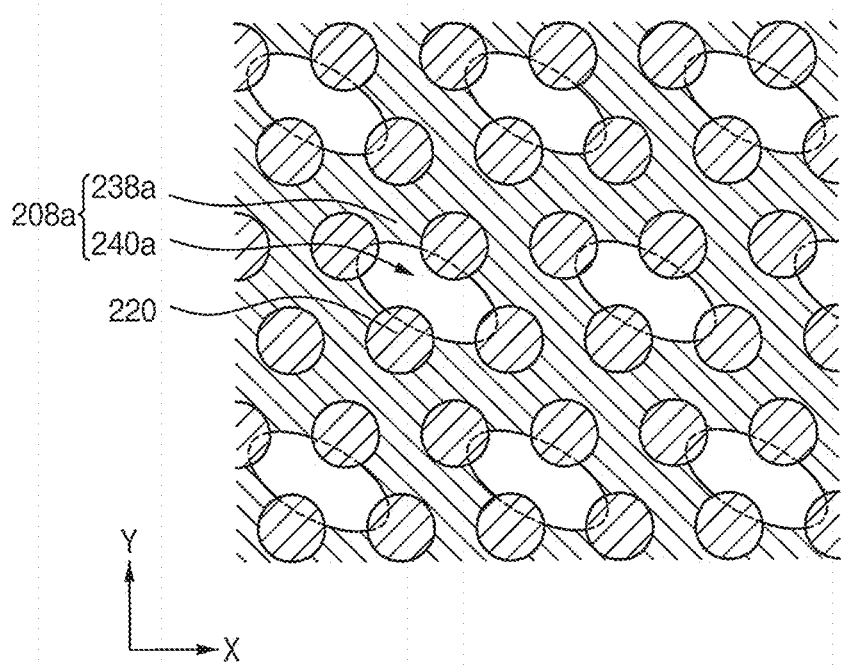

FIG. 7 is a plan view illustrating an example of cell capacitor of a memory cell region in a DRAM device in accordance with some example embodiments.

Referring to FIG. 7, the first lower electrodes 220 may be arranged in the honeycomb structure.

In some example embodiments, in the first upper support layer pattern 208a, one first opening 240a may be disposed between the four neighboring first lower electrodes 220. The one first opening may partially expose upper sidewalls of the four neighboring first lower electrodes.

In some example embodiments, neighboring first openings 240a may be arranged in parallel in the first direction X, and the neighboring first openings 240a may not be arranged in parallel in the second direction Y.

In the plan view, in the first upper support layer pattern 208a, one of the first openings 240a may partially expose two neighboring first lower electrodes arranged in an odd-numbered row and two neighboring first lower electrodes 220 arranged in an even-numbered row. In the plan view, the first opening 240a may have an elliptical shape, and a long axis of the first opening 240a may extend in an oblique direction oblique to the first direction X. In this case, a length of the long axis of the first opening 240a may be longer than a width (i.e., diameter) of the upper surface of the first lower electrode 220.

Although not shown, a first lower support layer pattern for supporting the central portion of the first lower electrode 220 may be formed, and the first lower support layer pattern may have the same shape as the first upper support layer pattern 208a.

Figure 8:
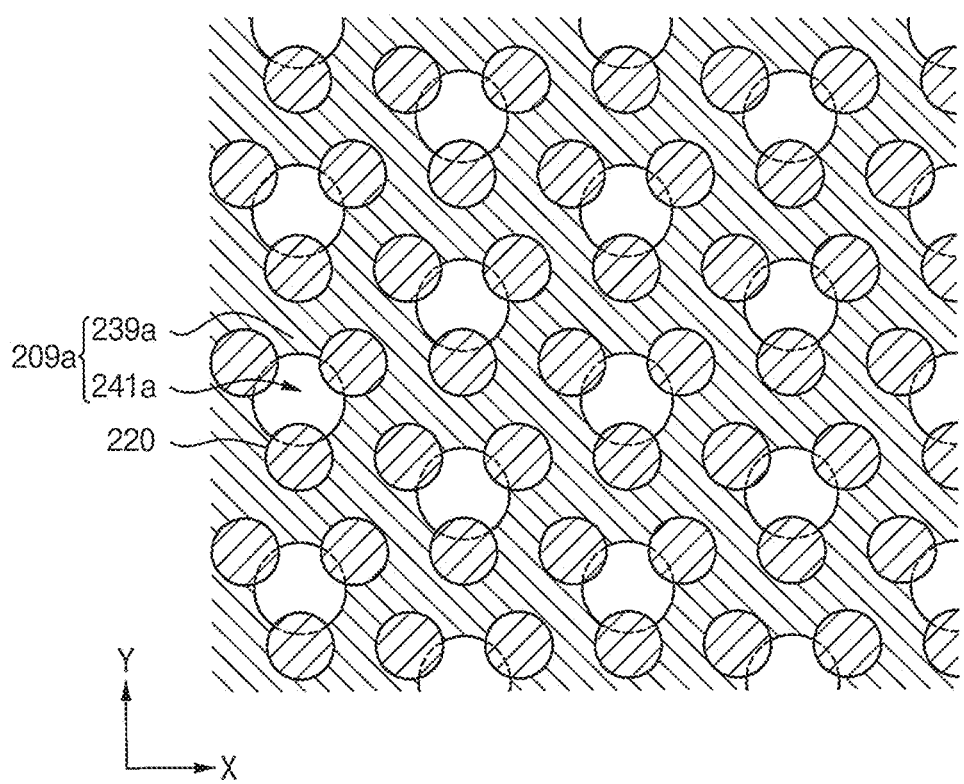

FIG. 8 is a plan view illustrating an example of cell capacitor of a memory cell region in a DRAM device in accordance with some example embodiments.

Referring to FIG. 8, the first lower electrodes 220 may be arranged in the honeycomb structure.

The first upper support layer pattern 209a may be the first upper plate 239a having the first openings 241a. The first upper plate 239a may be formed between upper portions of the first lower electrodes 220. The first openings 241a may be arranged to have a predetermined pattern.

In some example embodiments, in the first upper support layer pattern 209a, one first opening 241a may be disposed between three neighboring first lower electrodes 220, and the one first opening 241a may partially expose upper sidewalls of three neighboring first lower electrodes.

In the plan view, in the first upper support layer pattern 209a, each of the first openings 241a may partially expose three first lower electrodes 220 arranged in a virtual triangular shape. In the plan view, the first opening 241a may have a circular shape.

The first upper support layer pattern 209a may be limitedly used when the gap between the first lower electrodes 220 is sufficiently wide to pattern the first opening.

Although not shown, the first lower support layer pattern for supporting the central portion of the first lower electrode 220 may be formed, and the first lower support layer pattern may have a shape the same as a shape of the first upper support layer pattern 209a.

Figure 9:
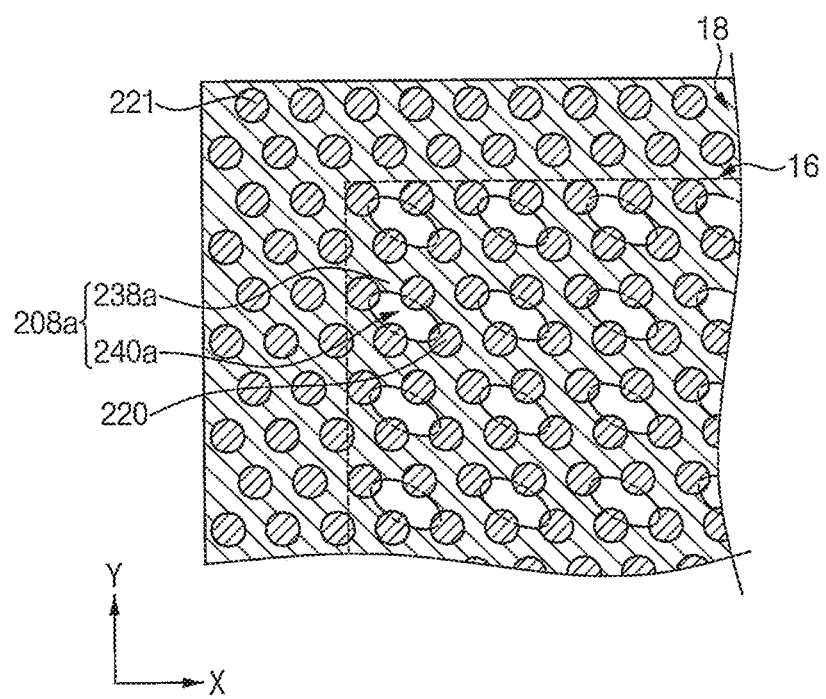

FIG. 9 is a plan view illustrating an example of cell capacitor of a memory cell region in a DRAM device in accordance with some example embodiments.

In order to simplify the drawing, only the first lower electrode and the first upper support layer pattern in the capacitors are illustrated.

Referring to FIG. 9, a substrate may include a memory cell region 16 in which memory cells are formed and a peripheral circuit region in which peripheral circuits for driving the memory cells are formed.

The memory cell region 16 may be a region in which actual memory cells that actually operate are formed. A cell block edge region 18 may surround an edge of the memory cell region 16, and the cell block edge region 18 may contact the edge of the memory cell region 16. Dummy memory cells may be formed on the cell block edge region 18. The dummy memory cells may not be electrically active during operation of the semiconductor device.

Dummy cell capacitors may be formed on the cell block edge region 18, and memory cell capacitors may be formed on the memory cell region 16.

The dummy cell capacitor may include a dummy first lower electrode 221, a first dielectric layer, and a first upper electrode. The memory cell capacitor may include the first lower electrode 220, the first dielectric layer, the first upper electrode, the first lower support layer pattern, and the first upper support layer pattern 208a.

The dummy first lower electrodes 221 may be disposed in the cell block edge region 18, and the first lower electrodes 220 may be disposed in the memory cell region 16. The dummy first lower electrodes 221 and the first lower electrodes 220 may be arranged in the honeycomb structure or honeycomb lattice or honeycomb pattern.

The dummy cell capacitor may not serve as a capacitor of actual memory cell, and the dummy cell capacitor may not include the first lower support layer pattern and the first upper support layer pattern. At least one dummy cell capacitor may be formed in the cell block edge region 18 in a direction from the memory cell region 16 to the cell block edge region 18.

As shown in FIG. 9, the memory cell capacitors may have a structure the same as a structure of the memory cell capacitor as shown in FIG. 4.

Alternatively, the memory cell capacitors may have a structure the same as a structure of the memory cell capacitor shown in FIG. 7 or FIG. 8.

Hereinafter, shapes of the second lower support layer pattern and the second upper support layer pattern used in the decoupling capacitor of the decoupling capacitor region are presented.

Figure 10:
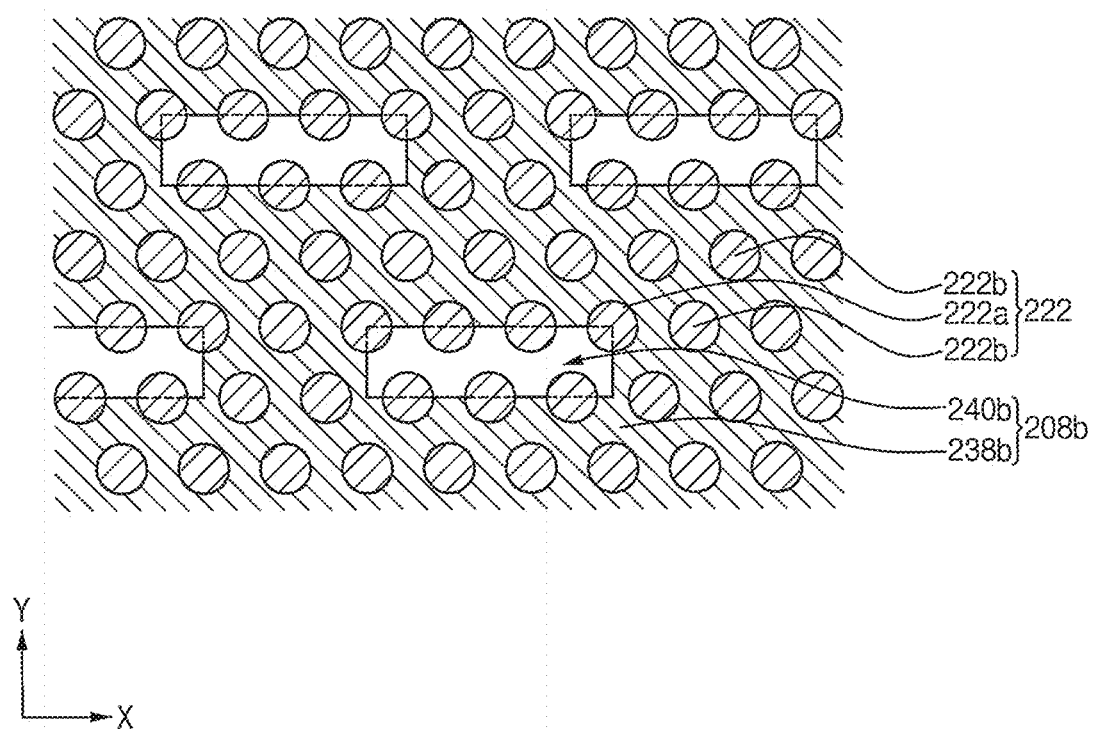

FIG. 10 is a plan view illustrating an example of a decoupling capacitor in a DRAM device in accordance with some example embodiments.

Referring to FIG. 10, the second lower electrodes 222 may be arranged in the honeycomb structure.

In some example embodiments, in the plan view, the second opening 240b of the second upper support layer pattern 208b may have a rectangular shape with the first direction X as the longitudinal direction. The second opening 240b may partially expose the plurality of second lower electrodes 222 arranged in two neighboring rows.

As shown in FIG. 10, one second opening 240b may be disposed between seven neighboring second lower electrodes 222, and the one second opening 240b may partially expose upper sidewalls of the seven neighboring second lower electrodes. The one of the second openings 240b may expose the second lower electrodes 222 arranged in two neighboring rows in the second direction Y. For example, the one of the second openings 240b may partially expose three second lower electrodes 222 arranged in a lower row and four second lower electrodes 222 arranged in an upper row. The second openings 240b may be spaced apart from each other. Neighboring second openings 240b may be arranged in parallel in the first direction X, and the neighboring second openings 240b may not be arranged in parallel in the second direction Y.

In FIG. 10, the second lower electrodes exposed by the second opening 240b are denoted by reference numeral 222a, and the second lower electrodes not exposed by the second opening 240b are denoted by reference numeral 222b.

At least one of the second lower electrodes 222b may pass through the second upper plate 238b between the second openings 240b in the first direction X, and the second lower electrode 222b may not be exposed by the second opening 240b.

Alternatively or additionally, the second lower electrodes 222b of one row adjacent to the second opening 240b in the second direction Y may not be exposed by the second opening 240b. Although not shown, the number of second lower electrodes 222a exposed by one second opening 240b may not be limited to seven.

FIGS. 11 to 17 are cross-sectional views illustrating a method of manufacturing/fabricating a semiconductor device in accordance with some example embodiments.

Figure 11:
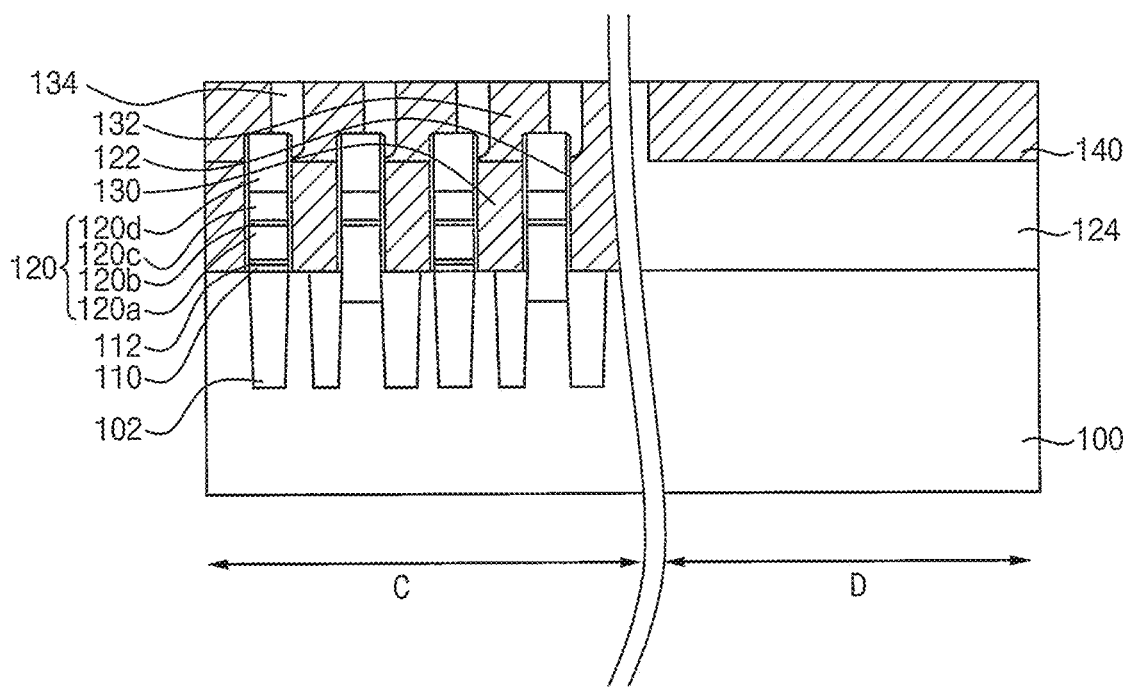

Referring to FIG. 11, a substrate 100 may include a memory cell region C and a peripheral circuit region. A decoupling capacitor region D may be included in the peripheral circuit region.

A shallow trench isolation (STI) process may be performed on the substrate 100 to form an isolation layer 102. The substrate 100 may be divided into an isolation region in which the isolation layer 102 is formed and an active region between the isolation layer 102.

Upper portions of the substrate 100 and the isolation layer 102 in the memory cell region C may be etched to form a gate trench (not shown) extending in the first direction X. A gate structure (not shown) may be formed in the gate trench. First and second impurity regions (not shown) may be formed at the active regions adjacent to both sides of the gate structure.

A pad insulation pattern 110 and a first etch stop layer pattern 112 may be formed on the active region, the isolation layer 102, and the gate structure in the memory cell region C. The pad insulation pattern 110 and the first etch stop layer pattern 112 may be formed with a chemical vapor deposition (CVD) process; however, example embodiments are not limited thereto. A recess may be formed at the substrate 100 on which the pad insulation pattern 110 and the first etch stop layer pattern 112 are not formed. A top surface of the first impurity region may be exposed on a bottom of the recess.

A bit line structure 120 extending in the second direction Y may be formed on the first etch stop layer pattern 112 and the recess in the memory cell region C. The bit line structure 120 may have a stacked structure including a conductive pattern 120a, a barrier metal pattern 120b, a metal pattern 120c, and a hard mask pattern 120d. In some example embodiments, a spacer 122 may be formed on a sidewall of the bit line structure 120.

In the process of forming the bit line structure 120, although not shown, a MOS transistor constituting/included in a peripheral circuit may be formed on the substrate 100 in the peripheral circuit region.

A first insulating interlayer 124 may be formed to fill a space between the bit line structures 120 and a space between the MOS transistors.

In the memory cell region C, a portion of the first insulating interlayer 124 between the bit line structures 120 may be etched to form a contact hole exposing the second impurity region of the substrate 100. A contact plug 130 and a landing pad 132 may be formed in the contact hole. An insulation pattern 134 may be formed between the landing pads 132.

In the process for forming the contact plug 130 and the landing pad 132, the common electrode 140 may be formed on the decoupling capacitor region D in the peripheral circuit region. The common electrode 140 may include a material the same as a material of the landing pad 132. In some example embodiments, upper surfaces of the landing pad 132 and the insulation pattern 134 and the common electrode 140 may be coplanar with each other.

Figure 12:
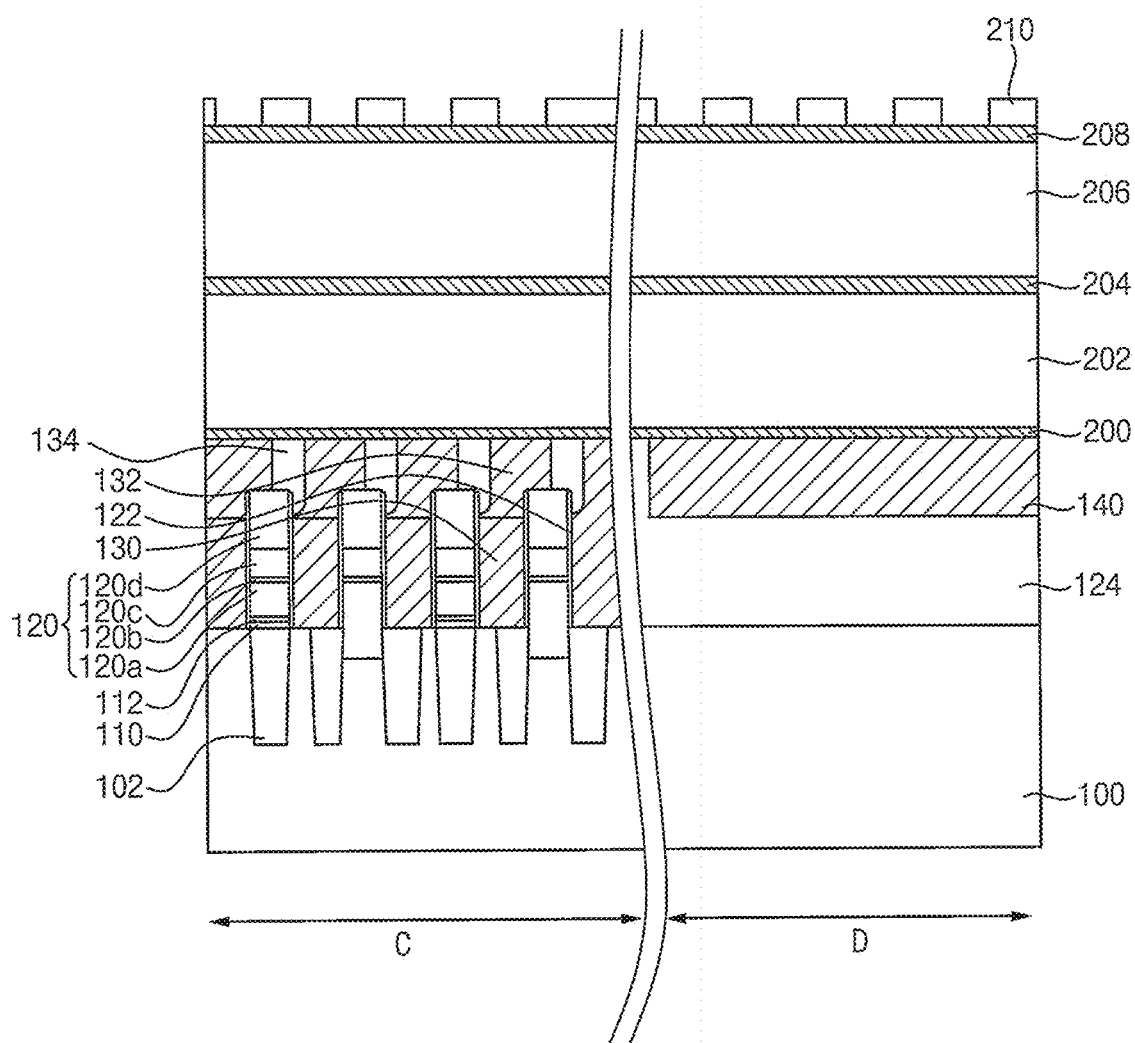

Referring to FIG. 12, a second etch stop layer 200 may be formed on the first insulating interlayer 124, the landing pad 132, the insulation pattern 134, and the common electrode 140. The second etch stop layer 200 may include, e.g., at least one of silicon nitride, silicon oxynitride, or the like.

A lower mold layer 202, a lower support layer 204, an upper mold layer 206, and an upper support layer 208 may be sequentially stacked on the second etch stop layer 200. The lower mold layer 202 and the upper mold layer 206 may include a material having an etch selectivity to the lower support layer 204 and the upper support layer 208. For example, the lower mold layer 202 and the upper mold layer 206 may include silicon oxide, and the lower support layer 204 and the upper support layer 208 may include silicon nitride.

A capacitor mask pattern 210 may be formed on the upper support layer 208 in the memory cell region C and the decoupling capacitor region D. The capacitor mask pattern 210 may include holes exposing portions for forming the first and second lower electrodes. The holes may be arranged in the honeycomb structure/honeycomb pattern. The capacitor mask pattern 210 may include amorphous carbon or polysilicon.

Figure 13:
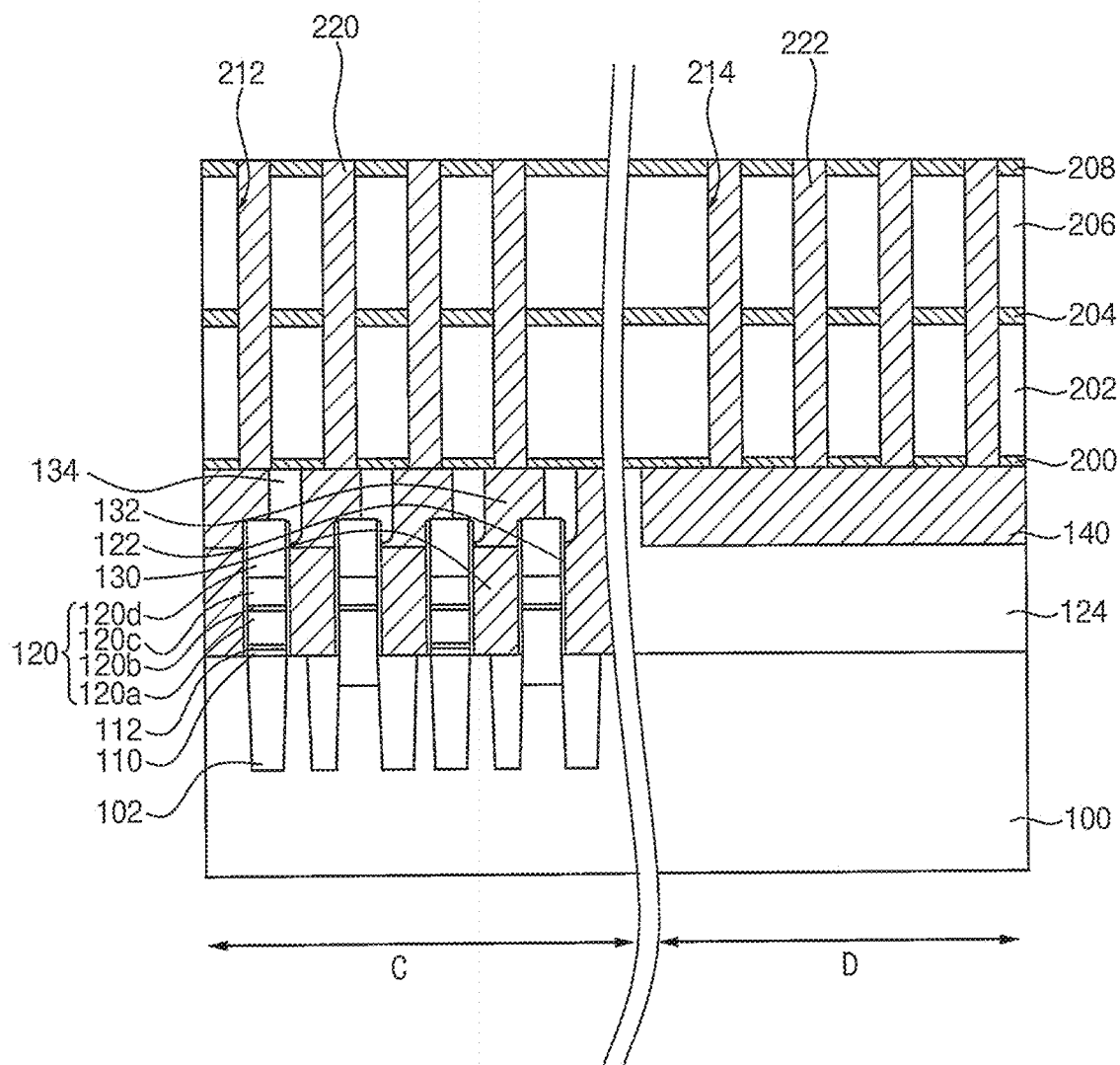

Referring to FIG. 13, the upper support layer 208, the upper mold layer 206, the lower support layer 204, the lower mold layer 202, and the second etch stop layer 200 may be etched using the capacitor mask pattern 210 as an etch mask to form a first hole 212 and a second hole 214. The etching process may include an anisotropic etching process such as a dry etching process.

Thus, the first holes 212 may expose a top surface of the landing pad 132 in the memory cell region C, and the second holes 214 may expose a top surface of the common electrode 140 in the decoupling capacitor region D.

Thereafter, a lower electrode layer may be formed to fill the first and second holes 212 and 214, and the lower electrode layer may be planarized, e.g. with a chemical mechanical planarization (CMP) process and/or with an etch-back process, until an upper surface of the upper support layer 208 may be exposed. Thus, first lower electrodes 220 may be formed in the first holes 212, and second lower electrodes 222 may be formed in the second holes 214. The lower electrode layer may include a metal such as at least one of Ti, W, Ni, or Co and/or a metal nitride such as at least one of TiN, TiSiN, TiAlN, TaN, TaSiN, or WN.

Figure 14:
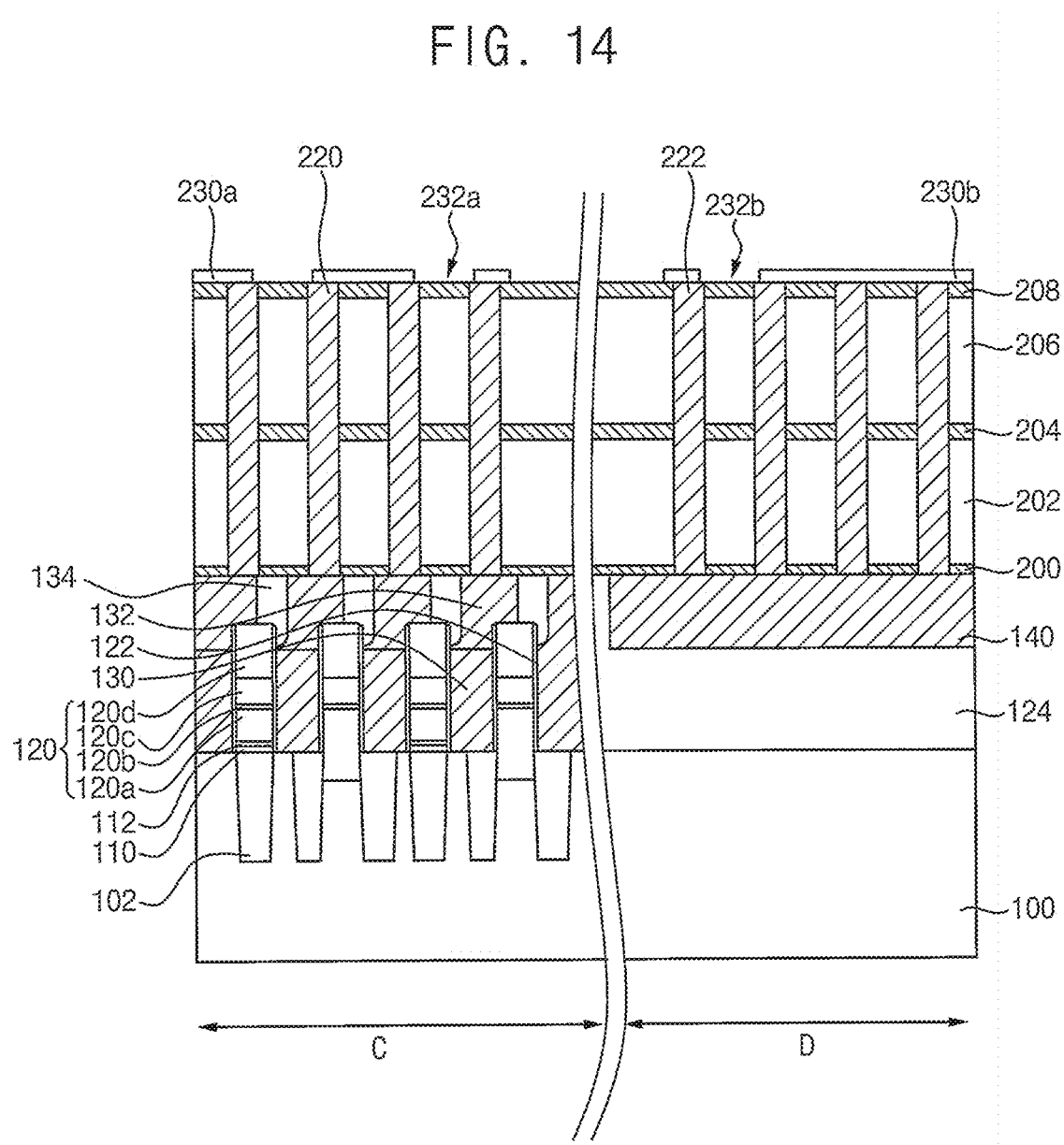

Referring to FIG. 14, a first mask layer may be formed on the upper support layer 208, the first lower electrode 220, and the second lower electrode 222. The first mask layer may include amorphous carbon and/or polysilicon.

The first mask layer may be patterned by an exposure process using a photomask to form a first mask pattern in the memory cell region C and a second mask pattern in the decoupling capacitor region D. The first mask pattern 230a may serve as a mask for forming a first upper support layer pattern, the second mask pattern 230b may serve as a mask for forming a second upper support layer pattern.

The first mask pattern 230a may include first mask holes 232a at positions corresponding positions of the first openings included in the first upper support layer pattern. In the first mask pattern 230a, the positions of the first mask holes 232a may be different depending on a shape of the first upper support layer pattern.

The second mask pattern 230b may include second mask holes 232b at positions corresponding positions of the second openings included in the second upper support layer pattern. In the second mask pattern 230b, the positions of the second mask holes 232b may be different depending on the shape of the second upper support layer pattern.

Figure 15:
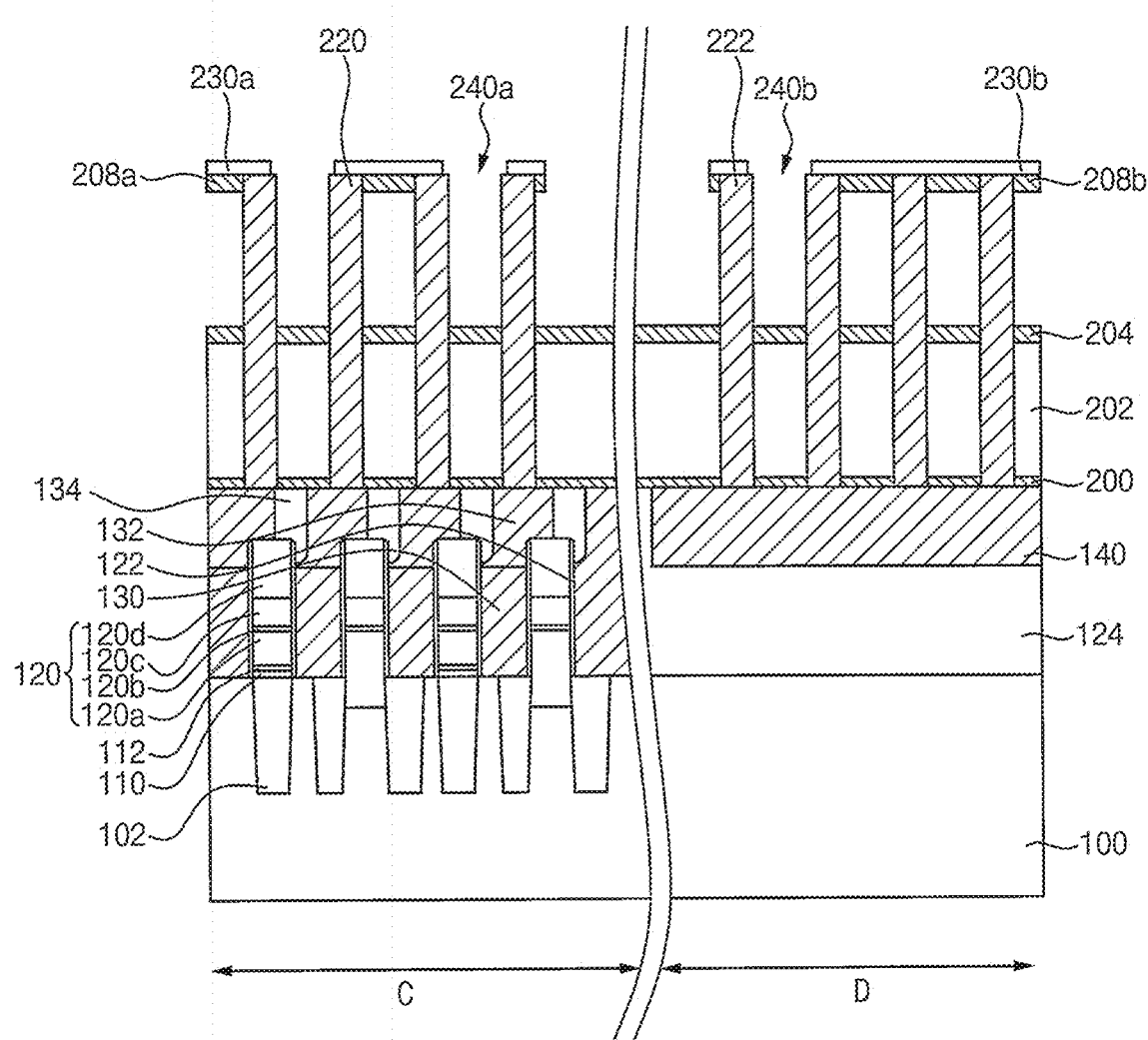

Referring to FIG. 15, the upper support layer 208 may be etched using the first and second mask patterns 230a and 230b as etching masks to form a first upper support layer pattern 208a in the memory cell region C and a second upper support layer pattern 208b in the decoupling capacitor region D. The etching process may include an anisotropic etching process, e.g., a dry etching process.

In the etching process, the first and second lower electrodes 220 and 222 may not be etched. In some examples, although not shown, exposed upper portions of the first and second lower electrodes 220 and 222 may be partially etched by the etching process.

The first upper support layer pattern 208a may include first openings 240a, and the second upper support layer pattern 208b may include second openings 240b.

After that, the upper mold layer 206 may be removed. The removal process may include an isotropic etching process, e.g., a wet etching process. For example, the upper mold layer 206 includes silicon oxide, and the etching process of the upper mold layer 206 may be performed using an etchant including at least one of HF, NH4F, and/or the like.

Figure 16:
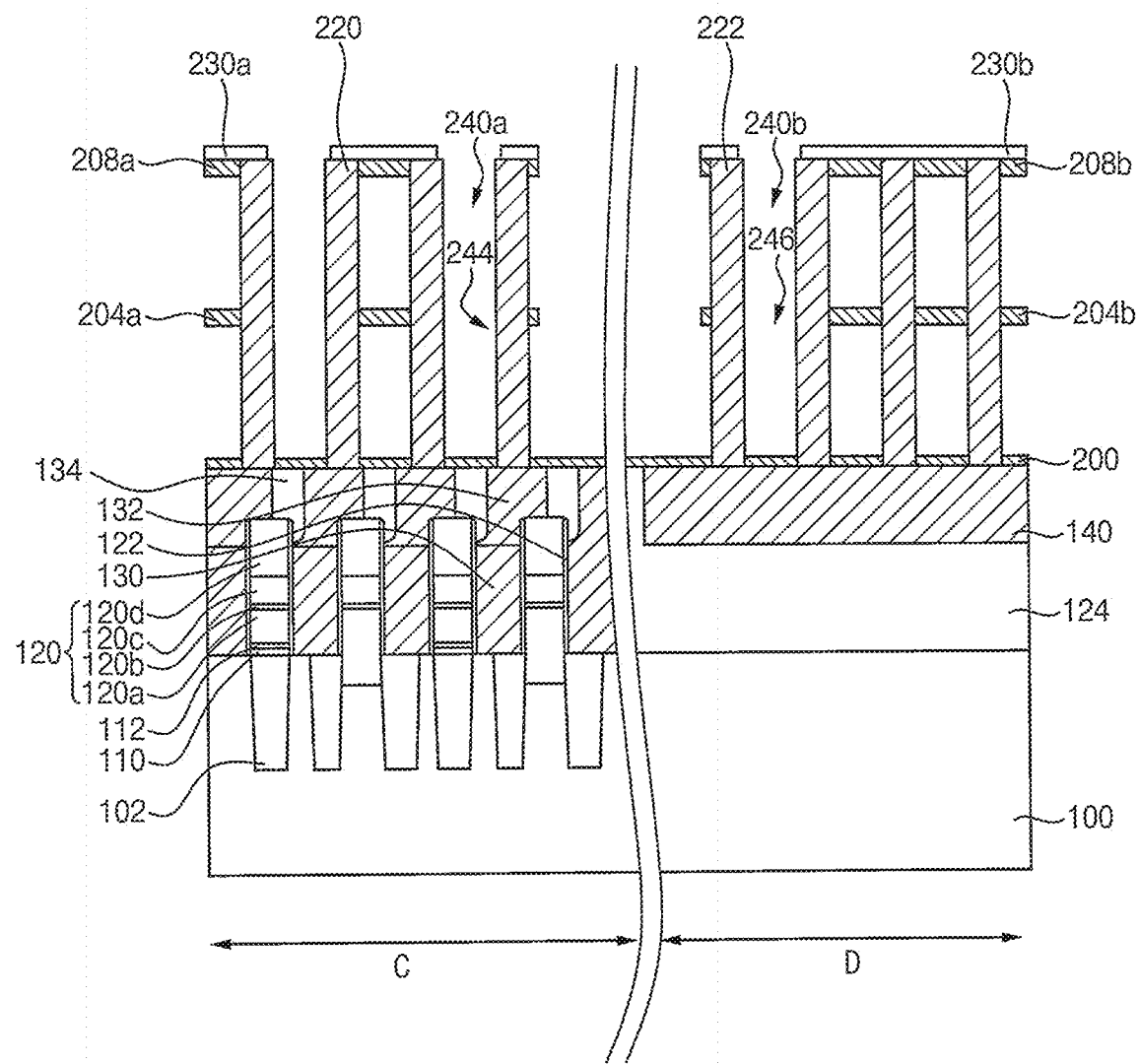

Referring to FIG. 16, the lower support layer 204 may be etched using the first and second mask patterns 230a and 230b to form a first lower support layer pattern 204a in the memory cell region C and a second lower support layer pattern 204b in the decoupling capacitor region D. The etching process may include an anisotropic etching process, e.g., a dry etching process. The first lower support layer pattern 204a may have substantially the same shape as the first upper support layer pattern 208a. The second lower support layer pattern 204b may have substantially the same shape as the second upper support layer pattern 208b.

The first lower support layer pattern 204a may include third openings 244, and the second lower support layer pattern 204b may include fourth openings 246.

After that, the lower mold layer 202 may be removed. The removal process may include an isotropic etching process, e.g., a wet etching process. For example, the lower mold layer 202 may include silicon oxide, an etching process of the lower mold layer 202 may be performed using an etchant including HF, NH4F, and/or the like.

Next, the first and second mask patterns 230a and 230b may be removed.

When the above process is performed, the first lower support layer pattern 204a and the first upper support layer pattern 208a for supporting the first lower electrode 220 may be formed in the memory cell region C. Further, the second lower support layer pattern 204b and the second upper support layer pattern 208b for supporting the second lower electrode 222 may be formed in the decoupling capacitor region D.

Figure 17:
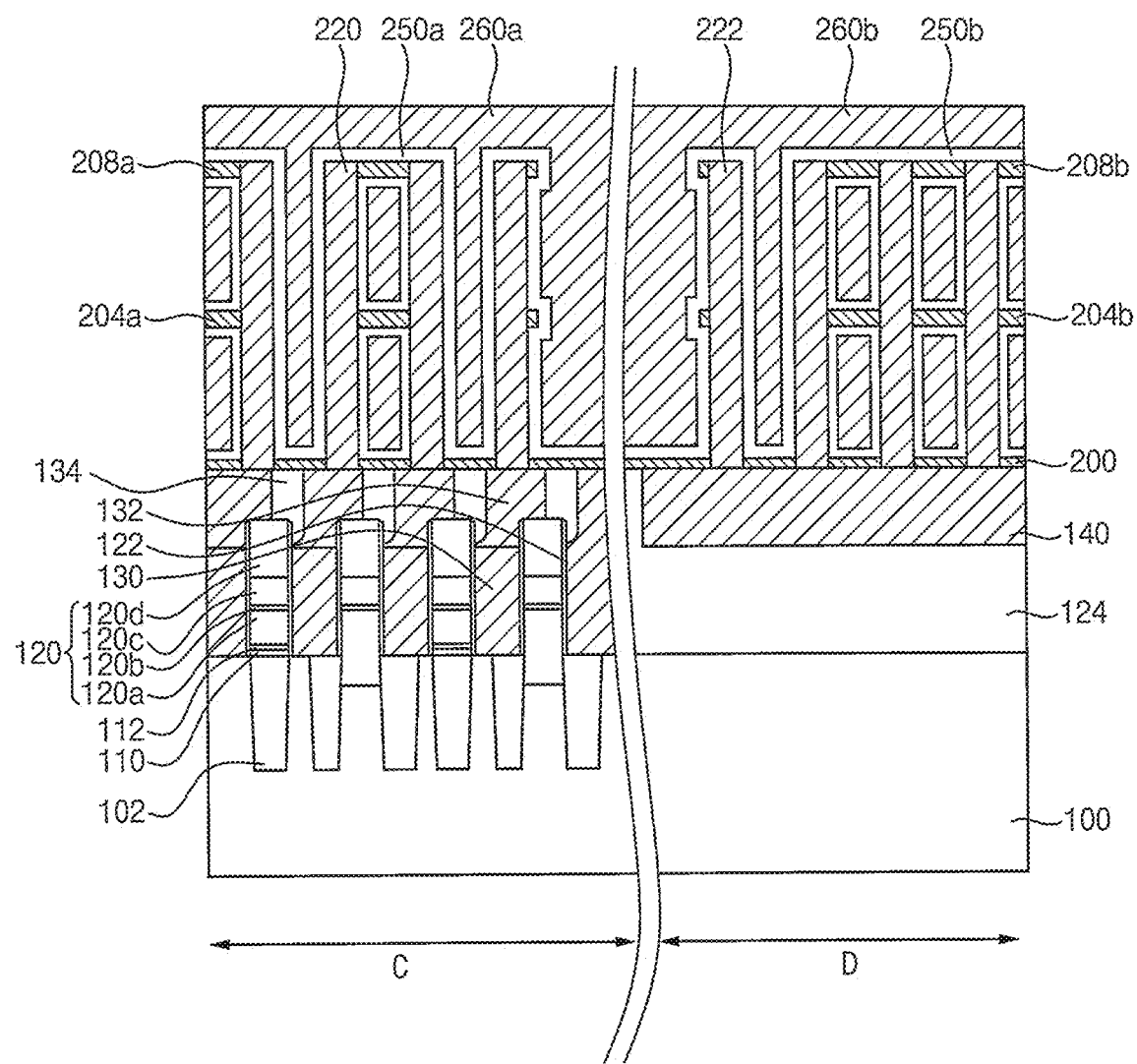

Referring to FIG. 17, a dielectric layer may be conformally formed on surfaces of the second etch stop layer 200, the first lower electrode 220, the second lower electrode 222, the first lower support layer pattern 204a, the first upper support layer pattern 208a, the second lower support layer pattern 204b and the second upper support layer pattern 208b.

The dielectric layer may include a metal oxide such as at least one of HfO2, ZrO2, Al2O3, La2O3, Ta2O3 and TiO2, a perovskite dielectric material such as at least one of SrTiO3 (STO), BaTiO3, PZT, PLZT, or a combination thereof. The dielectric layer may be formed by a CVD process and/or an atomic layer deposition (ALD) process.

The dielectric layer formed on the first lower electrode 220, the first lower support layer pattern 204a, and the first upper support layer pattern 208a may serve as a first dielectric layer 250a of the cell capacitor. The dielectric layer formed on the second lower electrode 222, the second lower support layer pattern 204b, and the second upper support layer pattern 208b may serve as a second dielectric layer 250b of the decoupling capacitor.

An upper electrode may be formed on the dielectric layer to cover the dielectric layer. In some example embodiments, the upper electrode may include a material the same as a material of the first lower electrode 220 and the second lower electrode 222. For example, the upper electrode may include TiN. The upper electrode may be formed by a CVD process and/or an ALD process.

The upper electrode formed on the first dielectric layer 250a may serve as a first upper electrode 260a of the cell capacitor. The first upper electrode 260a may fill a space between the first lower electrodes 220 and a space between the first lower support layer pattern 204a and the first upper support layer pattern 208a. The upper electrode formed on the second dielectric layer 250b may serve as a second upper electrode 260b of the decoupling capacitor. The second upper electrode 260b may fill a space between the second lower electrodes 222 and a space between the second lower support layer pattern 204b and the second upper support layer pattern 208b.

A DRAM device may be manufactured/fabricated by the above process. The support layer pattern of the cell capacitor and the support layer pattern of the decoupling capacitor in the DRAM device may have different shapes and different arrangements. Thus, defects in the DRAM device may be decreased in impact and/or in likelihood of occurrence.

The foregoing is illustrative of example embodiments and is not to be construed as limiting thereof. Although a few example embodiments have been described, those skilled in the art will readily appreciate that many modifications are possible in various example embodiments without materially departing from the novel teachings and advantages of inventive concepts. Accordingly, all such modifications are intended to be included within the scope of inventive concepts as defined in the claims. Example embodiments are further not necessarily mutually exclusive with one another. For example, some example embodiments may include features described with reference to one or more figures, and may also include features described with reference to one or more other figures. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to various example embodiments disclosed, and that modifications to the disclosed example embodiments, as well as other example embodiments, are intended to be included within the scope of the appended claims.

What is claimed is:

1. A semiconductor device, comprising:
a cell capacitor on a memory cell region of a substrate, the cell capacitor including a plurality of first lower electrodes, a first upper support layer pattern, a first dielectric layer, and a first upper electrode; and
a decoupling capacitor on a decoupling capacitor region of the substrate, the decoupling capacitor including a plurality of second lower electrodes, a second upper support layer pattern, a second dielectric layer, and a second upper electrode,
wherein the plurality of first and second lower electrodes are arranged in a honeycomb pattern, which is arranged at each vertex of a hexagon and a center of the hexagon,
the plurality of first and second lower electrodes correspond to rows extending along a first direction, and each of the rows are arranged in a second direction perpendicular to the first direction,
the first upper support layer pattern is connected to upper sidewalls of the plurality of first lower electrodes, the first upper support layer pattern is between the plurality of first lower electrodes, and the first upper support layer pattern corresponds to a first plate defining first openings, wherein all of the plurality of first lower electrodes are partially exposed by the first openings,
the second upper support layer pattern is connected to the upper sidewalls of the second lower electrodes, the second upper support layer pattern is between the plurality of second lower electrodes, and the second upper support layer pattern corresponds to a second plate defining second openings, wherein some of the plurality of second lower electrodes are partially exposed by the second openings, and some of the plurality of second lower electrodes are not exposed by the second openings.

2. The semiconductor device of claim 1, wherein one first opening exposes four first lower electrodes arranged in a plurality of neighboring rows, and each of the first openings has an elliptical shape in a plan view.

3. The semiconductor device of claim 2, wherein one first opening exposes four first lower electrodes arranged in two neighboring rows, and each of the first openings has the elliptical shape with a long axis in an oblique direction that is oblique to the first direction in the plan view.

4. The semiconductor device of claim 1, wherein one first opening exposes four first lower electrodes arranged in three neighboring rows, and each of the first openings has an elliptical shape with a long axis in the second direction in a plan view.

5. The semiconductor device of claim 1, wherein one second opening exposes a plurality of second lower electrodes arranged in a plurality of neighboring rows.

6. The semiconductor device of claim 5, wherein the one second opening exposes three second lower electrodes arranged in two neighboring rows, and each of the second openings has a circular shape in a plan view.

7. The semiconductor device of claim 5, wherein the one second opening exposes a plurality of second lower electrodes arranged in two neighboring rows, and each of the second openings has a rectangular shape having the first direction as a longitudinal direction.

8. The semiconductor device of claim 1, wherein some of the rows of the plurality of second lower electrodes includes exposed second lower electrodes exposed by the second openings and non-exposed second lower electrodes not exposed by the second openings, and
the exposed second lower electrodes and the non-exposed second lower electrodes are alternately and repeatedly arranged.

9. The semiconductor device of claim 1, wherein the first openings are arranged in parallel in the first direction, and neighboring first openings are not arranged in parallel in the second direction.

10. The semiconductor device of claim 1, wherein the second openings are arranged in parallel in the first direction, and neighboring second openings are not arranged in parallel in the second direction.

11. The semiconductor device of claim 1, wherein bottoms of the second lower electrodes contact a common electrode.

12. A semiconductor device, comprising:
a substrate including a memory cell region and a decoupling capacitor region;
a cell lower structure including a plurality bit line structures, a plurality contact plugs, and a plurality pad electrodes, the plurality bit line structures, the plurality of contact plugs, and the pad electrodes on the memory cell region of the substrate;
a common electrode on the decoupling capacitor region of the substrate;
a plurality of first lower electrodes on the plurality of pad electrodes, respectively, the plurality of first lower electrodes arranged in a honeycomb pattern, which is arranged at each vertex of a hexagon and a center of the hexagon;
a first upper support layer pattern connected to upper sidewalls of the first lower electrodes, the first upper support layer pattern between the first lower electrode, and the first upper support layer pattern corresponding to a first plate defining first openings;
a first dielectric layer and a first upper electrode, the first dielectric layer and the first upper electrode on surfaces of the plurality of the first lower electrodes and the first upper support layer;
a plurality of second lower electrodes on the common electrode, the plurality of the second lower electrodes arranged in the honeycomb pattern;
a second upper support layer pattern connected to upper sidewalls of the plurality of second lower electrodes, the second upper support layer pattern between the plurality of second lower electrodes, and the plurality of second upper support layer pattern corresponding to a second plate defining second openings different from the first openings; and
a second dielectric layer and a second upper electrode, the second dielectric layer and the second electrode on surfaces of the plurality of second lower electrodes and the second upper support layer pattern,
wherein the first and second lower electrodes correspond to rows extending along a first direction, and each of the rows are arranged in a second direction perpendicular to the first direction, and
the plurality of second lower electrodes include exposed second lower electrodes exposed by the second openings and non-exposed second lower electrodes not exposed by the second openings.

13. The semiconductor device of claim 12, wherein upper sidewalls of all of the plurality of first lower electrodes are partially exposed by the first openings.

14. The semiconductor device of claim 12, wherein one first opening exposes four first lower electrodes arranged in two neighboring rows, and each of the first openings has an elliptical shape with a long axis in an oblique direction oblique to the first direction in a plan view.

15. The semiconductor device of claim 12, wherein one first opening exposes four first lower electrodes arranged in two neighboring rows, and each of the first openings has an elliptical shape with a long axis in the second direction in a plan view.

16. The semiconductor device of claim 12, wherein the one second opening exposes three second lower electrodes, and each of the second openings has a circular shape in a plan view.

17. The semiconductor device of claim 12, wherein the one second opening exposes a plurality of second lower electrodes arranged in two neighboring rows, and each of the second openings has a rectangular shape having the first direction as a longitudinal direction.

18. The semiconductor device of claim 12, further comprising:
a cell block edge region surrounding an edge of the memory cell region, wherein a dummy cell capacitor including dummy first lower electrodes, a first dielectric layer, and a first upper electrode is on the cell block edge region.

19. The semiconductor device of claim 12, further comprising:
a first lower support layer pattern between the plurality of first lower electrodes to be connected to center portions of the first lower electrodes, and the first lower support layer pattern having the same shape as the first upper support layer pattern; and
a second lower support layer pattern between the plurality of second lower electrodes to be connected to center portions of the second lower electrodes, and the second lower support layer pattern having the same shape as the second upper support layer pattern.

20. A semiconductor device, comprising:
a cell capacitor on a memory cell region of a substrate, the cell capacitor including a plurality of first lower electrodes, a first upper support layer pattern, a first dielectric layer, and a first upper electrode; and a decoupling capacitor on a decoupling capacitor region of the substrate, the decoupling capacitor including a plurality of second lower electrodes, a second upper support layer pattern, a second dielectric layer, and a second upper electrode;

wherein the first and second lower electrodes are arranged in a honeycomb pattern, which is arranged at each vertex of a hexagon and a center of the hexagon, wherein the plurality of first and second lower electrodes correspond to rows extending along a first direction, and each of the rows are arranged in a second direction perpendicular to the first direction, the first upper support layer pattern is between the first lower electrodes to be connected to upper sidewalls of the plurality of first lower electrodes, and the first upper support layer pattern corresponds to a first plate defining first openings, wherein one first opening partially exposes a plurality of the first lower electrodes, and each of the first openings has an elliptical shape in a plan view, the second upper support layer pattern is between the plurality of second lower electrodes to be connected to upper sidewalls of the second lower electrodes, and the second upper support layer pattern corresponds to a second plate defining second openings different from the first openings, all of the first lower electrodes are partially exposed by the first openings, and some of the second lower electrodes are partially exposed by the second openings, and some of second lower electrodes are not exposed by the second openings.

* * * * *